United States Patent
Okutani et al.

(10) Patent No.: US 11,177,124 B2
(45) Date of Patent: Nov. 16, 2021

(54) SUBSTRATE PROCESSING METHOD AND SUBSTRATE PROCESSING APPARATUS

(71) Applicant: SCREEN Holdings Co., Ltd., Kyoto (JP)

(72) Inventors: Manabu Okutani, Kyoto (JP); Hiroshi Abe, Kyoto (JP)

(73) Assignee: SCREEN Holdings Co., Ltd.

( * ) Notice: Subject to any disclaimer, the term of this patent is extended or adjusted under 35 U.S.C. 154(b) by 95 days.

(21) Appl. No.: 16/257,174

(22) Filed: Jan. 25, 2019

(65) Prior Publication Data

US 2019/0237322 A1 Aug. 1, 2019

(30) Foreign Application Priority Data

Jan. 31, 2018 (JP) .............................. JP2018-015253

(51) Int. Cl.
| | |
|---|---|
| *H01L 21/02* | (2006.01) |
| *B08B 3/10* | (2006.01) |
| *H01L 21/687* | (2006.01) |
| *H01L 21/67* | (2006.01) |

(52) U.S. Cl.
CPC .......... *H01L 21/02057* (2013.01); *B08B 3/10* (2013.01); *B08B 3/106* (2013.01); *H01L 21/02054* (2013.01); *H01L 21/02087* (2013.01); *H01L 21/67028* (2013.01); *H01L 21/67051* (2013.01); *H01L 21/67103* (2013.01); *H01L 21/67109* (2013.01); *H01L 21/6875* (2013.01)

(58) Field of Classification Search
CPC ......... H01L 21/02057; H01L 21/02041; B08B 3/10
See application file for complete search history.

(56) References Cited

U.S. PATENT DOCUMENTS

| | | | |
|---|---|---|---|
| 2004/0011388 A1 | 1/2004 | Tanaka et al. ................. 134/105 |
| 2004/0195207 A1* | 10/2004 | Tanaka .............. H01L 21/67109 |
| | | | 216/59 |
| 2014/0127908 A1* | 5/2014 | Okutani .............. H01L 21/0206 |
| | | | 438/694 |
| 2015/0090298 A1 | 4/2015 | Nagashima et al. ............ 134/19 |
| 2015/0093905 A1 | 4/2015 | Fujiwara et al. ............. 438/745 |
| 2015/0243542 A1* | 8/2015 | Yoshihara .......... H01L 21/02057 |
| | | | 156/345.15 |
| 2016/0214148 A1 | 7/2016 | Okutani et al. |
| 2017/0182515 A1 | 6/2017 | Emoto et al. |

FOREIGN PATENT DOCUMENTS

| | | |
|---|---|---|
| JP | 2004-055722 A | 2/2004 |
| JP | 2015-092537 A | 5/2015 |
| KR | 10-2015-0035388 A | 4/2015 |
| KR | 10-2017-0077052 A | 7/2017 |

* cited by examiner

*Primary Examiner* — Natasha N Campbell
(74) *Attorney, Agent, or Firm* — Ostrolenk Faber LLP

(57) ABSTRACT

A substrate processing method includes a liquid film forming step of forming a liquid film of the processing liquid on the upper surface of the substrate; a liquid filling heating step of supplying a heating medium to a space between a heater unit and the substrate to thereby fill the space with the heating medium, and heating the heating medium by the heater unit, an opening defining step of defining an opening in the central region of the liquid film in a state where the substrate is heated in the liquid filling heating step such that the temperature of the substrate is the boiling point of the processing liquid or higher, and an opening enlarging step of enlarging the opening while rotating the base to thereby rotate the substrate. The liquid filling heating step is executed in parallel with the opening enlarging step at least during part of a period of the opening enlarging step.

6 Claims, 11 Drawing Sheets

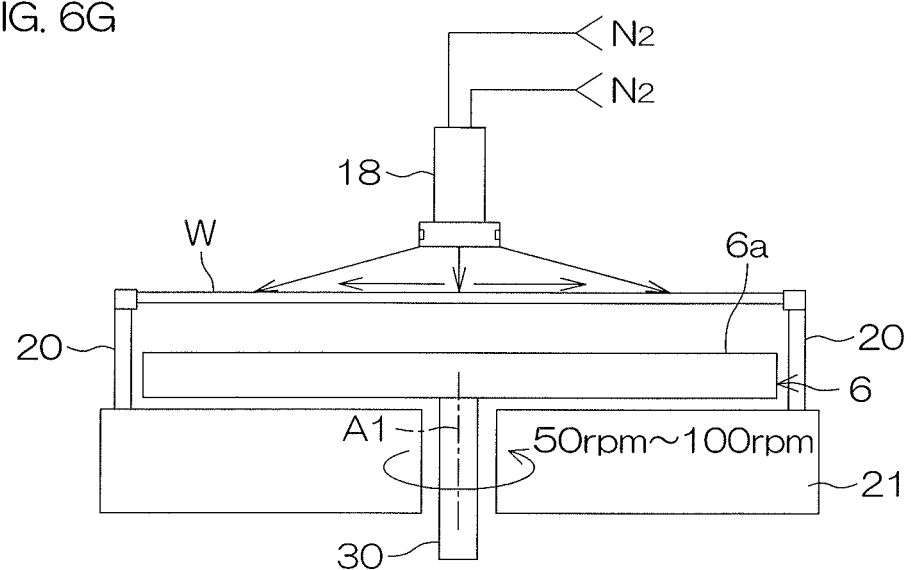

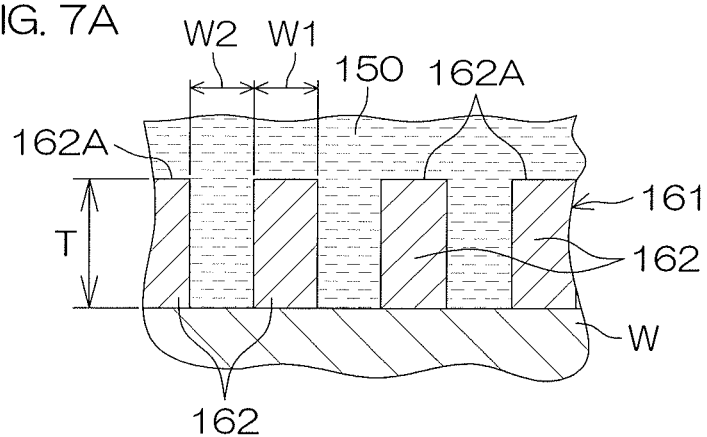
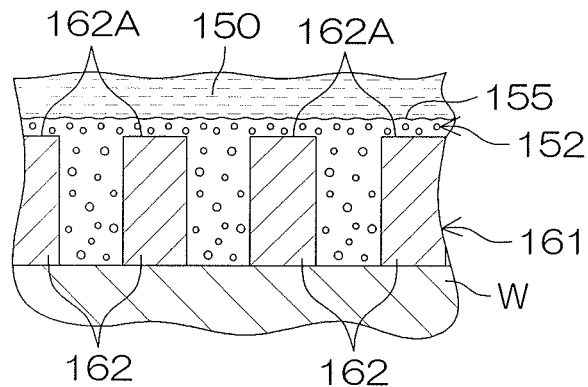
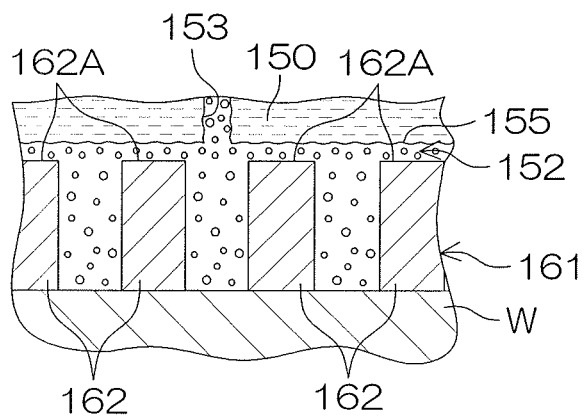

SUBSTRATE PROCESSING METHOD AND SUBSTRATE PROCESSING APPARATUS

CROSS REFERENCE TO RELATED APPLICATIONS

The present application claims the priority right based on Japanese Patent Application No. 2018-15253 filed on Jan. 31, 2018 in the Japan Patent Office, and the entire disclosure of this application is incorporated herein by reference.

BACKGROUND OF THE INVENTION

1. Field of the Invention

The present invention relates to a substrate processing method and a substrate processing apparatus for processing substrates. For example, substrates to be processed include semiconductor wafers, substrates for liquid crystal display devices, substrates for FPDs (Flat Panel Displays) such as organic EL (Electroluminescence) display devices, substrates for optical disks, substrates for magnetic disks, substrates for magneto-optical discs, substrates for photomasks, ceramic substrates, and substrates for solar batteries.

2. Description of the Related Art

For example, in substrate processing performed by a single substrate processing type substrate processing apparatus that processes substrates one by one, a substrate is held substantially horizontally with a spin chuck and supplied with a chemical liquid. After that, the substrate is supplied with a rinse liquid, thereby replacing the chemical liquid on the substrate with the rinse liquid. Thereafter, the rinse liquid on the substrate is removed in a spin dry step.

As illustrated in FIG. 10, when a pattern is formed on the front surface of the substrate, there is a possibility that the rinse liquid that has entered the inside of the pattern cannot be removed in the spin dry step. This may result in the substrate being not sufficiently dried. Since the liquid surface (the interface between air and the liquid) of the rinse liquid that has entered the inside of the pattern is formed inside of the pattern, the surface tension of the liquid acts on contact positions between the liquid surface and the pattern. When this surface tension is high, the pattern may easily collapse. Since water as a typical rinse liquid that has a high surface tension, the collapse of the pattern in the spin dry step cannot be ignored.

Therefore, it has been suggested to supply isopropyl alcohol (IPA) that is an organic solvent that has a lower surface tension than water. The upper surface of the substrate is processed with the IPA, thereby replacing the water that has entered the inside of the pattern with the IPA. After that, the IPA is removed, thereby drying the upper surface of the substrate.

However, recently, because of high integration, fine patterns (e.g., pillar-shaped patterns, line-shaped patterns), which are fine and have a high aspect ratio, are formed. Those fine patterns which are fine and have a high aspect ratio, tend to easily collapse. Thus, after a liquid film of IPA is formed on the upper surface of the substrate, it is necessary to shorten the time in which surface tension acts on the fine patterns.

Therefore, suggested in United States Patent Application No. 2016/214148 is a substrate processing method for heating a substrate with a heater. Heating the substrate with the heater causes a vapor-phase layer of IPA to be formed between the liquid film of IPA and the upper surface of the substrate. This causes the inside of the fine pattern to be filled in with the vapor-phase IPA. In this state, a nitrogen gas is blown to the center of the liquid film to define an opening at the center of the liquid film. The opening is enlarged to thereby remove the IPA on the substrate. In this method, since the inside of the fine pattern is filled in with vapor-phase IPA, the time in which surface tension acts upon the fine pattern can be shortened when compared with a method in which the IPA in the fine pattern is gradually vaporized from above.

SUMMARY OF THE INVENTION

However, in the substrate processing method disclosed in United States Patent Application No. 2016/214148, in order to heat the substrate up to a temperature at which a vapor-phase layer of IPA is formed, a heater raises the substrate such that the heater is in contact with the lower surface of the substrate. In this state, since the substrate is spaced apart from a spin chuck, the substrate cannot be rotated. Thus, since the substrate processing method disclosed in United States Patent Application No. 2016/214148 is not capable of applying a centrifugal force on a liquid film, the opening of the liquid film is enlarged only by the force of a blowing of nitrogen gas. However, the substrate is cooled by the blowing of nitrogen gas, and this leads to the possibility that the IPA cannot maintain the vapor-phase layer when the opening is enlarged.

Therefore, one object of the present invention is to provide a substrate processing method and a substrate processing apparatus which is capable of, while maintaining a vapor-phase layer between the liquid film of a processing liquid and the upper surface of the substrate, enlarging an opening defined on a liquid film.

A preferred embodiment of the present invention includes a substrate holding step of holding a substrate by a substrate holding jig, the substrate holding jig being provided on an upper surface of a base and horizontally holding the substrate spaced apart upwardly from the upper surface of the base, a liquid film forming step of supplying a processing liquid to the upper surface of the substrate to thereby form a liquid film of the processing liquid on the upper surface of the substrate, a liquid filling heating step of supplying a heating medium to a space between a heater unit, which is provided between the substrate and the base, and the substrate to thereby fill the space with the heating medium, and heating the heating medium by the heater unit; an opening defining step of defining an opening in the central region of the liquid film on the substrate in a state where the substrate is heated in the liquid filling heating step such that the temperature of the substrate is the boiling point of the processing liquid or higher, and an opening enlarging step of enlarging the opening while rotating the base to thereby rotate the substrate around a rotational axis along a vertical direction. The liquid filling heating step is executed in parallel with the opening enlarging step at least during part of a period of the opening enlarging step.

According to this method, in the liquid filling heating step, the heating medium filled in the space between the heater unit and the substrate is heated by the heater unit, so that the substrate is heated by the heating medium filled in the space. Thus, the substrate can be heated by the heater unit via the heating medium in a state where the substrate is held by the substrate holding jig provided on the base. It is thus possible to sufficiently heat the substrate while rotating the substrate by rotating the base.

Since the substrate is heated to the boiling point of the processing liquid or higher when the opening is defined in the liquid film, a portion of the liquid film in the vicinity of the upper surface of the substrate is vaporized to produce a vapor-phase layer between the liquid film and the upper surface of the substrate. Then, when the opening is enlarged, the liquid filling heating step is executed at least during part of that period. It is thus possible to enlarge the opening while preventing a decrease in the temperature of the substrate. Therefore, while the state that the vapor-phase layer is formed is being maintained, the opening can be enlarged.

Note that although the liquid filling heating step is to be executed in parallel at least during part of the opening enlarging step, this means that if the vapor-phase layer can be maintained in the opening enlarging step, there may be a duration in which the liquid filling heating step is not executed in the opening enlarging step.

In a preferred embodiment of the present invention, the liquid filling heating step includes a rotational supply step of supplying the heating medium to the space while rotating the substrate. Thus, a centrifugal force acts upon the heating medium supplied to the space between the substrate and the heater unit. This enables the heating medium to be evenly spread over the entire space.

In a preferred embodiment of the present invention, the liquid filling heating step is continued at least until the circumferential edge of the opening reaches the circumferential edge region of the upper surface of the substrate. Thus, in the opening enlarging step, the vapor-phase layer tends to be maintained with greater ease.

After the circumferential edge of the opening reaches the outer circumferential region of the upper surface of the substrate, the liquid filled state of the space between the substrate and the heater unit can be released as required. This makes it possible to dry the lower surface of the substrate in parallel with the drying of the upper surface of the substrate. Thus, the time required for the substrate processing can be shortened.

In a preferred embodiment of the present invention, the substrate processing method further includes a heating medium supply stopping step of stopping supply of the heating medium after the space is filled with the heating medium and before the opening defining step is started.

According to this method, after the space between the heater unit and the substrate is filled with the heating medium and before the opening defining step is started, the heating medium located in the space is no longer replaced. Thus, the temperature of the heating medium located in the space is sufficiently increased by the heat transferred from the heater unit until the opening defining step is started after the supply of the heating medium to the space is stopped. Thus, in the opening defining step, the vapor-phase layer tends to be maintained with greater ease.

In a preferred embodiment of the present invention, the substrate processing method further includes a heating medium replacing step of replacing the heating medium located in the space by supplying the heating medium to a position between the central region of the lower surface of the substrate and the heater unit during execution of the opening enlarging step.

The heating medium located between the circumferential edge region of the lower surface of the substrate and the heater unit tends to be reduced in temperature by being affected from outside the space between the substrate and the heater unit.

Therefore, if the heating medium is supplied to a position between the central region of the lower surface of the substrate and the heater unit during execution of the opening enlarging step, the heating medium located in a portion of the space between the circumferential edge region of the lower surface of the substrate and the heater unit can be pushed out of the space by the heating medium located inside with respect to the portion between the circumferential edge region of the lower surface of the substrate and the heater unit. Thus, the heating medium located in the portion of the space between the circumferential edge region of the lower surface of the substrate and the heater unit is replaced by the inner heating medium that is hardly affected by outside the space. Thus, until the opening enlarging step is ended, the temperature in the vicinity of the circumferential edge portion of the substrate can be maintained at the boiling point of the processing liquid or higher with greater ease.

In a preferred embodiment of the present invention, the substrate processing method further includes a heating medium supply stopping step of stopping supply of the heating medium after the space is filled with the heating medium and before the opening defining step is started, and a heating medium replacing step of replacing the heating medium located in the space by supplying the heating medium to a position between the central region of the lower surface of the substrate and the heater unit during execution of the opening enlarging step. Furthermore, the supply flow rate of the heating medium in the heating medium replacing step is less than the supply flow rate of the heating medium before the heating medium supply stopping step.

According to this method, after the space between the heater unit and the substrate is filled with the heating medium and before the opening defining step is started, the heating medium located in the space is no longer replaced. Thus, the temperature of the heating medium located in the space is sufficiently increased by the heat transferred from the heater unit until the opening defining step is started after the supply of the heating medium to the space is stopped. Thus, in the opening defining step, the vapor-phase layer tends to be maintained with greater ease.

Furthermore, if the heating medium is supplied to a position between the central region of the lower surface of the substrate and the heater unit during execution of the opening enlarging step, the heating medium located in a portion of the space between the circumferential edge region of the lower surface of the substrate and the heater unit can be pushed out of the space by the heating medium located inside with respect to the portion of the space between the circumferential edge region of the lower surface of the substrate and the heater unit. Thus, the heating medium located in the portion of the space between the circumferential edge region of the lower surface of the substrate and the heater unit is replaced by the inner heating medium that is hardly affected by outside the space. Thus, until the opening enlarging step is ended, the temperature of the circumferential edge region of the substrate can be maintained at the boiling point of the processing liquid or higher with greater ease.

Furthermore, the flow rate of the heating medium before the heating medium supply stopping step is relatively high. It is thus possible to shorten the time required to raise the temperature of the substrate to the boiling point of the processing liquid or higher in the liquid filling heating step.

On the other hand, the flow rate of a heating medium is relatively low when the heating medium located between the substrate and the heater unit is replaced. It is thus possible to lengthen the time required for the heating medium supplied to a portion of the space between the central region of the lower surface of the substrate and the heater unit to move to a portion of the space between the circumferential edge region of the lower surface of the substrate and the heater unit. Thus, while the heating medium supplied to the portion of the space between the central region of the lower surface of the substrate and the heater unit is moved to the portion of the space between the circumferential edge region of the lower surface of the substrate and the heater unit, the heating medium is further sufficiently heated by the heater unit.

In a preferred embodiment of the present invention, the opening defining step includes a step of disposing the heater unit at a first position that is located in close proximity to the substrate. Then, the heating medium replacing step includes a step of disposing the heater unit at a second position that is further spaced apart from the substrate than the first position.

According to this method, in the opening defining step, the heater unit is disposed at the first position. Thus, a space between the substrate and the heater unit is relatively narrow. Thus, the time required to turn the space into a liquid filled state can be shortened. On the other hand, in the heating medium replacing step, the heater unit is disposed at the second position that is further spaced apart from the substrate than the first position. Thus, the space between the substrate and the heater unit is relatively large. This makes it possible to comparatively reduce the amount of heating medium that is replaced in a unit time by the heating medium being supplied. Therefore, the heating medium being supplied can prevent the temperature of the heating medium located in the space from being drastically lowered.

In a preferred embodiment of the present invention, the opening defining step includes a step of defining the opening by supplying a gas to the central region of the liquid film. It is thus possible to quickly form the opening in the central region of the liquid film.

In a preferred embodiment of the present invention, the opening enlarging step includes a processing liquid suction step of sucking the processing liquid, which constitutes the liquid film, through a suction nozzle.

According to this method, the processing liquid is sucked through the suction nozzle, thereby supporting the enlargement of the opening. Thus, the time required to execute the opening enlarging step can be shortened. In turn, the time required for the substrate processing can be shortened.

In a preferred embodiment of the present invention, the substrate processing method includes a rinse liquid supply step of supplying a rinse liquid, which washes away the upper surface of the substrate, to the upper surface of the substrate, and a replacement step of supplying a low surface tension liquid, which has a lower surface tension than the rinse liquid, to the upper surface of the substrate as the processing liquid to thereby replace the rinse liquid with the low surface tension liquid. Then, the liquid film forming step includes a step of forming, as the liquid film, a liquid film of the low surface tension liquid on the upper surface of the substrate.

Thus, the upper surface of the substrate can be dried by removing the liquid film of a low surface tension liquid, which has a lower surface tension than the rinse liquid, from the substrate. Thus, the surface tension that acts on the upper surface of the substrate when the liquid film is removed from the substrate can be further reduced.

A preferred embodiment of the present invention provides a substrate processing apparatus which includes a substrate holding jig which horizontally holds a substrate spaced apart upwardly from the upper surface of a base, a processing liquid supply unit which supplies a processing liquid to the upper surface of the substrate, a heater unit provided between the substrate and the base, a heating medium supply unit which supplies a heating medium to a space between the substrate and the heater unit, an opening defining unit which defines an opening in a central region of a liquid film of the processing liquid to be formed on the upper surface of the substrate, a substrate rotating unit which rotates the base to thereby rotate the substrate around a rotational axis along the vertical direction, and a controller which controls the processing liquid supply unit, the heater unit, the heating medium supply unit, the opening defining unit, and the substrate rotating unit.

Then, the controller is programmed so as to execute: a liquid film forming step of supplying a processing liquid from the processing liquid supply unit to the upper surface of the substrate held by the substrate holding jig to thereby form the liquid film of the processing liquid on the upper surface of the substrate, a liquid filling heating step of supplying a heating medium from the heating medium supply unit to the space to thereby fill the space with the heating medium, and heating the heating medium by the heater unit, an opening defining step of defining the opening in the liquid film by the opening defining unit while heating the substrate in the liquid filling heating step such that the temperature of the substrate is the boiling point of the processing liquid or higher, and an opening enlarging step of enlarging the opening while rotating the substrate by the substrate rotating unit. The controller is also programmed such that the liquid filling heating step is executed in parallel with the opening enlarging step at least during part of a period of the opening enlarging step.

According to this configuration, in the liquid filling heating step, the heating medium filled in the space between the heater unit and the substrate is heated by the heater unit, so that the substrate is heated by the heating medium filled in the space. Thus, the substrate can be heated by the heater unit via the heating medium in a state where the substrate is held by the substrate holding jig provided on the base. It is thus possible to sufficiently heat the substrate while rotating the substrate by rotating the base.

Since the substrate is heated to the boiling point of the processing liquid or higher when the opening is defined in the liquid film, a portion of the liquid film in the vicinity of the upper surface of the substrate is vaporized to produce a vapor-phase layer between the liquid film and the upper surface of the substrate. Then, when the opening is enlarged, the liquid filling heating step is executed at least during part of that period. It is thus possible to enlarge the opening while preventing a decrease in the temperature of the substrate. Therefore, while the state that the vapor-phase layer is formed is being maintained, the opening can be enlarged.

Note that although the liquid filling heating step is to be executed in parallel at least during part of the opening enlarging step, this means that if the vapor-phase layer can be maintained in the opening enlarging step, there may be a duration in which the liquid filling heating step is not executed in the opening enlarging step.

In a preferred embodiment of the present invention, the controller is programmed so as to execute a rotational supply step of supplying the heating medium from the heating medium supply unit to the space while the substrate is rotated by the substrate rotating unit in the liquid filling heating step. Thus, a centrifugal force acts on the heating medium supplied to the space between the substrate and the heater unit. This enables the heating medium to be evenly spread over the entire space.

In a preferred embodiment of the present invention, the controller is programmed so as to continue the liquid filling heating step at least until the circumferential edge of the opening reaches the outer circumferential region of the upper surface of the substrate. Thus, in the opening enlarging step, the vapor-phase layer tends to be maintained with greater ease. Furthermore, after the circumferential edge of the opening reaches the outer circumferential region of the upper surface of the substrate, the liquid filled state of the space between the substrate and the heater unit can be released as required. This makes it possible to dry the lower surface of the substrate in parallel with the drying of the upper surface of the substrate. Thus, the time required for the substrate processing can be shortened.

In a preferred embodiment of the present invention, the controller is programmed so as to execute a heating medium supply stopping step of stopping supply of the heating medium from the heating medium supply unit after the space is filled with the heating medium and before the opening defining step is started.

According to this configuration, after the space between the heater unit and the substrate is filled with the heating medium and before the opening defining step is started, the heating medium located in the space is no longer replaced. Thus, the temperature of the heating medium located in the space is sufficiently increased by the heat transferred from the heater unit until the opening defining step is started after the supply of the heating medium to the space is stopped. Thus, in the opening defining step, the vapor-phase layer tends to be maintained with greater ease.

In a preferred embodiment of the present invention, the controller is programmed to execute a heating medium replacing step of replacing the heating medium located in the space by supplying the heating medium from the heating medium supply unit to a position between the central region of the lower surface of the substrate and the heater unit during execution of the opening enlarging step.

The heating medium located between the circumferential edge region of the lower surface of the substrate and the heater unit tends to be reduced in temperature by being affected from outside the space between the substrate and the heater unit.

Therefore, if the heating medium is supplied to a position between the central region of the lower surface of the substrate and the heater unit during execution of the opening enlarging step, the heating medium located in a portion of the space between the circumferential edge region of the lower surface of the substrate and the heater unit can be pushed out of the space by the heating medium located inside with respect to the portion between the circumferential edge region of the lower surface of the substrate and the heater unit. Thus, the heating medium located in the portion of the space between the circumferential edge region of the lower surface of the substrate and the heater unit is replaced by the inner heating medium that is hardly affected by outside the space. Thus, until the opening enlarging step is ended, the temperature in the vicinity of the circumferential edge portion of the substrate can be maintained at the boiling point of the processing liquid or higher with greater ease.

In a preferred embodiment of the present invention, the controller is programmed so as to execute a heating medium supply stopping step of stopping supply of the heating medium from the heating medium supply unit after the space is filled with the heating medium and before the opening defining step is started, and a heating medium replacing step of replacing the heating medium located in the space by supplying the heating medium from the heating medium supply unit to a position of the space filled with the heating medium between the central region of the substrate and the heater unit during execution of the opening enlarging step. Then, the supply flow rate of the heating medium in the heating medium replacing step is less than the supply flow rate of the heating medium before the heating medium supply stopping step.

According to this configuration, after the space between the heater unit and the substrate is filled with the heating medium and before the opening defining step is started, the heating medium located in the space is no longer replaced. Thus, the temperature of the heating medium located in the space is sufficiently increased by the heat transferred from the heater unit until the opening defining step is started after the supply of the heating medium to the space is stopped. Thus, in the opening defining step, the vapor-phase layer tends to be maintained with greater ease.

Furthermore, if the heating medium is supplied to a position between the central region of the lower surface of the substrate and the heater unit during execution of the opening enlarging step, the heating medium located in a portion of the space between the circumferential edge region of the lower surface of the substrate and the heater unit can be pushed out of the space by the heating medium located inside with respect to the portion of the space between the circumferential edge region of the lower surface of the substrate and the heater unit. Thus, the heating medium located in the portion of the space between the circumferential edge region of the lower surface of the substrate and the heater unit is replaced by the inner heating medium that is hardly affected by outside the space. Thus, until the opening enlarging step is ended, the temperature of the circumferential edge region of the substrate can be maintained at the boiling point of the processing liquid or higher with greater ease.

Furthermore, the flow rate of the heating medium before the heating medium supply stopping step is relatively high. It is thus possible to shorten the time required to raise the temperature of the substrate to the boiling point of the processing liquid or higher in the liquid filling heating step.

On the other hand, the flow rate of a heating medium is relatively low when the heating medium located between the substrate and the heater unit is replaced. It is thus possible to lengthen the time required for the heating medium supplied to a portion of the space between the central region of the lower surface of the substrate and the heater unit to move to a portion of the space between the circumferential edge region of the lower surface of the substrate and the heater unit. Thus, while the heating medium supplied to the portion of the space between the central region of the lower surface of the substrate and the heater unit is moved to the portion of the space between the circumferential edge region of the lower surface of the substrate and the heater unit, the heating medium is further sufficiently heated by the heater unit.

In a preferred embodiment of the present invention, the substrate processing apparatus further includes a heater raising/lowering unit which raises and lowers the heater unit. Then, the controller is programmed such that the heater raising/lowering unit disposes the heater unit at a first position that is located in close proximity to the substrate in the opening defining step, and in the heating medium replacing step, the heater raising/lowering unit disposes the heater unit at a second position that is further spaced apart from the substrate than the first position.

According to this configuration, in the opening defining step, the heater unit is disposed at the first position. Thus, a space between the substrate and the heater unit is relatively narrow. Thus, the time required to turn the space into a liquid filled state can be shortened. On the other hand, in the heating medium replacing step, the heater unit is disposed at the second position that is further spaced apart from the substrate than the first position. Thus, the space between the substrate and the heater unit is relatively large. It is thus possible to comparatively reduce the amount of heating medium that is replaced in a unit time by the heating medium being supplied. Therefore, the heating medium being supplied makes it possible to prevent the temperature of the heating medium located in the space from being drastically lowered.

In a preferred embodiment of the present invention, the opening defining unit includes a gas supply unit which supplies a gas to the central region of the upper surface of the substrate. Then, the controller is programmed so as to execute a step of defining the opening by supplying the gas from the gas supply unit to the central region of the liquid film in the opening defining step. It is thus possible to quickly define the opening in the central region of the liquid film.

In a preferred embodiment of the present invention, the substrate processing apparatus further includes a suction nozzle which sucks the processing liquid on the substrate. Then, the controller is programmed so as to execute a processing liquid suction step of sucking the processing liquid, which constitutes the liquid film, through the suction nozzle in the opening enlarging step.

According to this configuration, the processing liquid is sucked through the suction nozzle, thereby supporting the enlargement of the opening. Thus, the time required to execute the opening enlarging step can be shortened. In turn, the time required for the substrate processing can be shortened.

In a preferred embodiment of the present invention, the substrate processing apparatus further includes a rinse liquid supply unit that supplies a rinse liquid, which washes away the upper surface of the substrate, to the upper surface of the substrate. Then, the processing liquid supply unit further includes a low surface tension liquid supply unit which supplies a low surface tension liquid having a lower surface tension than the rinse liquid to the upper surface of the substrate.

Then, the controller is programmed so as to execute a rinse liquid supply step of supplying the rinse liquid to the upper surface of the substrate, and a replacement step of supplying the low surface tension liquid to the upper surface of the substrate to thereby replace the rinse liquid with the low surface tension liquid, and so as to form a liquid film of the low surface tension liquid on the upper surface of the substrate in the liquid film forming step.

Thus, the upper surface of the substrate can be dried by removing the liquid film of the low surface tension liquid, which has a lower surface tension than the rinse liquid, from the substrate. Thus, the surface tension that acts on the upper surface of the substrate when the liquid film is removed from the substrate can be further reduced.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6A to FIG. 6G are diagrammatic cross-sectional views illustrating the low surface tension liquid processing.

FIG. 7A to FIG. 7C are schematic cross-sectional views illustrating the perimeter of an upper surface of a substrate when a liquid film is removed from the substrate in the low surface tension liquid processing.

DETAILED DESCRIPTION OF THE PREFERRED EMBODIMENTS

First Preferred Embodiment

Figure 1:
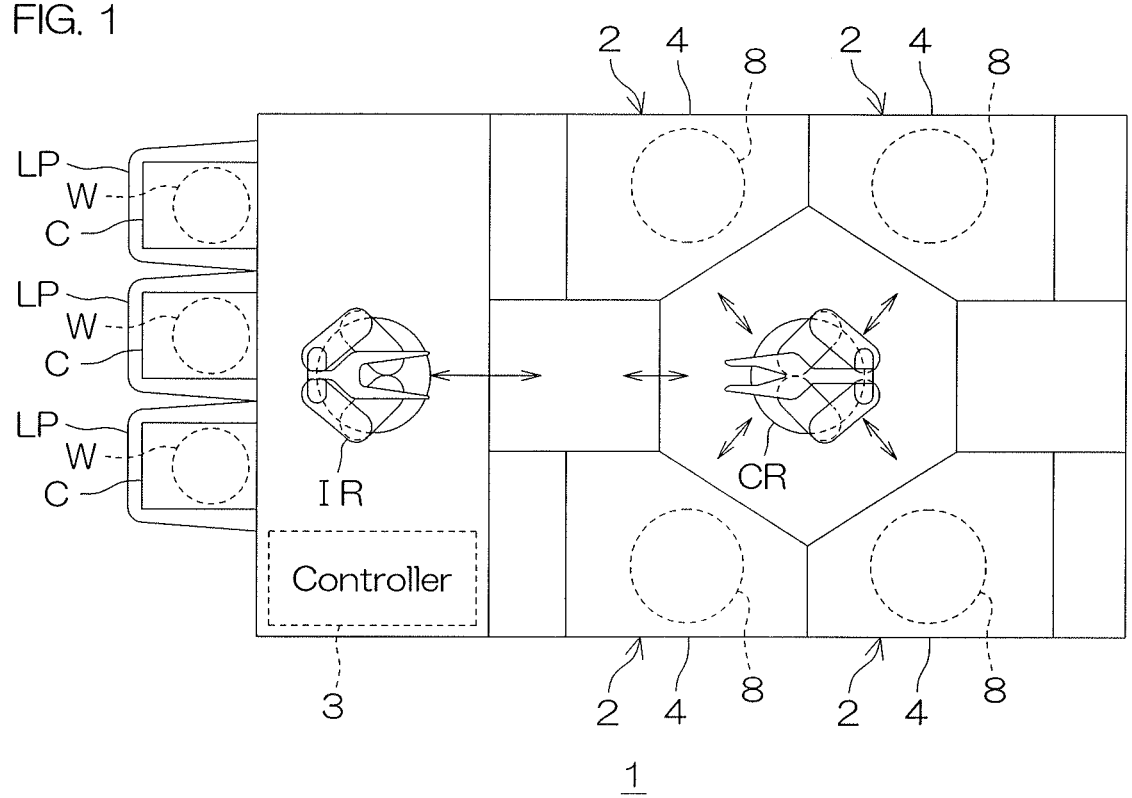
FIG. 1 is a schematic plan view illustrating the layout of the inside of a substrate processing apparatus according to a first preferred embodiment of the present invention.

FIG. 1 is a schematic plan view illustrating the layout of the inside of a substrate processing apparatus 1 according to a first preferred embodiment of the present invention. The substrate processing apparatus 1 is a single substrate processing type apparatus which processes substrates W, such as silicon wafers, one by one. Referring to FIG. 1, the substrate processing apparatus 1 includes a plurality of processing units 2 which each process the substrate W with a processing fluid, a load port LP in which placed is a carrier C that accommodates a plurality of substrates W to be processed in the processing units 2; transfer robots IR and CR which transfer a substrate W between a load port LP and a processing unit 2, and a controller 3 which controls the substrate processing apparatus 1.

The transfer robot IR transfers a substrate W between a carrier C and the transfer robot CR. The transfer robot CR transfers the substrate W between the transfer robot IR and a processing unit 2. For example, the plurality of processing units 2 are configured in the same manner. Processing fluids include a liquid such as a chemical liquid, a rinse liquid, a processing liquid (low surface tension liquid), and a heating medium or a gas such as an inert gas, to be discussed later.

Figure 2:
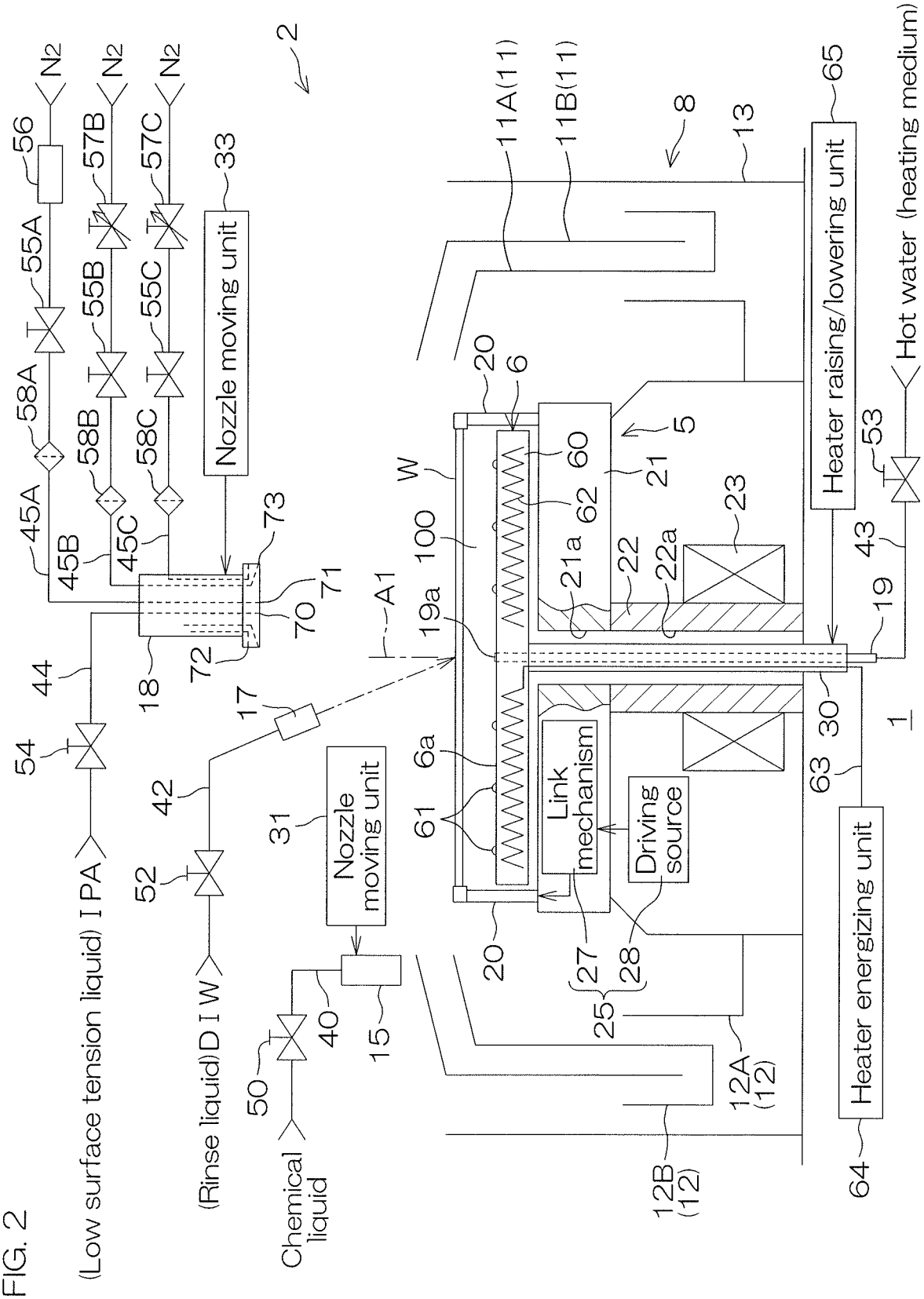
FIG. 2 is a schematic view illustrating a processing unit provided in the substrate processing apparatus.

FIG. 2 is a view schematically illustrating an example configuration of the processing unit 2. The processing unit 2 includes a spin chuck 5, a processing cup 8, a first movable nozzle 15, a second movable nozzle 18, a fixed nozzle 17, a lower surface nozzle 19, and a heater unit 6.

The spin chuck 5 rotates the substrate W around a vertical rotational axis A1 that passes through the central portion of the substrate W while horizontally holding the substrate W. The spin chuck 5 is included in a substrate holding unit that horizontally holds the substrate W. The substrate holding unit is also referred to as the substrate holder. The spin chuck 5 includes a plurality of chuck pins 20, a spin base 21, a rotating shaft 22, and an electric motor 23.

The spin base 21 has a disk shape along the horizontal direction. On the upper surface of the spin base 21, the plurality of chuck pins 20 are disposed at certain intervals in the circumferential direction. The plurality of chuck pins 20 are included in a substrate holding jig which is provided on the upper surface of the base (the spin base 21) and horizontally holds the substrate W at a certain interval above the upper surface of the base.

The plurality of chuck pins 20 can be opened and closed between the closed state of grasping the substrate W in contact with the circumferential end of the substrate W and the opened state in which the pins are retracted from the circumferential end of the substrate W. Furthermore, in the opened state, the plurality of chuck pins 20 are spaced apart from the circumferential end of the substrate W to release the grasping, while supporting the substrate W from below in contact with the lower surface of the circumferential edge portion of the substrate W.

The processing unit 2 further includes a chuck pin drive unit 25 which drives the plurality of chuck pins 20 to open or close. For example, the chuck pin drive unit 25 includes a link mechanism 27 built in the spin base 21 and a driving source 28 disposed outside the spin base 21. For example, the driving source 28 includes a ball screw mechanism and an electric motor for imparting driving force to the ball screw mechanism.

The rotating shaft 22 is extended along the rotational axis A1 in the vertical direction. The upper end portion of the rotating shaft 22 is coupled to the center of the lower surface of the spin base 21. At the central region of the spin base 21 in a plan view is formed a through hole 21a that vertically penetrates the spin base 21. The through hole 21a communicates with an inner space 22a of the rotating shaft 22.

The electric motor 23 imparts a rotational force to the rotating shaft 22. The rotating shaft 22 is rotated by the electric motor 23, thereby rotating the spin base 21. This causes the substrate W to be rotated around the rotational axis A1. Hereafter, the radially inward direction with the rotational axis A1 at the center will be referred to simply as "the radially inward direction," while the radially outward direction with the rotational axis A1 at the center will be referred to simply as "the radially outward direction." The electric motor 23 is included in a substrate rotating unit that rotates the base (the spin base 21) to thereby rotate the substrate W around the rotational axis A1.

The processing cup 8 includes a plurality of guards 11 which receive a liquid scattered outwardly from the substrate W retained in the spin chuck 5, a plurality of cups 12 which receive the liquid guided downwardly by the plurality of guards 11, and a cylindrical outer wall member 13 that surrounds the plurality of guards 11 and the plurality of cups 12. In this preferred embodiment is shown an example in which two guards 11 (a first guard 11A and a second guard 11B) and two cups 12 (a first cup 12A and a second cup 12B) are provided.

The first cup 12A and the second cup 12B each have a groove-shaped form that is opened upwardly. The first guard 11A surrounds the spin base 21. The second guard 11B surrounds the spin base 21 at a radially outward position with respect to the first guard 11A. The first cup 12A receives a liquid guided downwardly by the first guard 11A. The second cup 12B is formed integrally with the first guard 11A and receives the liquid guided downwardly by the second guard 11B.

Referring back to FIG. 1, the processing cup 8 is accommodated (housed) inside a chamber 4. An entrance (not illustrated), through which the substrate W is loaded into the chamber 4 or the substrate W is unloaded out of the chamber 4, is formed in the chamber 4. The chamber 4 is provided with a shutter unit (not illustrated) which opens or closes this entrance.

Referring back to FIG. 2, the first movable nozzle 15 is included in a chemical liquid supply unit which supplies (discharges) a chemical liquid to the upper surface of the substrate W. The chemical liquid discharged from the first movable nozzle 15 is, e.g., a hydrofluoric acid. The chemical liquid discharged from the first movable nozzle 15 is not limited to the hydrofluoric acid.

That is, the chemical liquid discharged from the first movable nozzle 15 may be a liquid which contains at least one of sulfuric acid, acetic acid, nitric acid, hydrochloric acid, hydrofluoric acid, ammonia water, aqueous hydrogen peroxide, organic acid (e.g., citric acid, oxalic acid), organic alkali (e.g., TMAH: tetramethylammonium hydroxide), a surfactant, and a corrosion inhibitor. Example chemical liquids into which these are mixed include, e.g., SPM (sulfuric acid/hydrogen peroxide mixture) and SC1 (ammonia-hydrogen peroxide mixture).

The first movable nozzle 15 is connected to a chemical liquid pipe 40 which guides a chemical liquid. When a chemical liquid valve 50 disposed in the chemical liquid pipe 40 is opened, the chemical liquid is continuously discharged in a downward direction from the first movable nozzle 15.

The first movable nozzle 15 is moved by a first nozzle moving unit 31 in the horizontal and vertical directions. The first movable nozzle 15 is capable of moving between a center position and a home position (a retracted position). When being located at the center position, the first movable nozzle 15 faces the rotational center of the upper surface of the substrate W. The rotational center of the upper surface of the substrate W is the position at which the upper surface of the substrate W intersects the rotational axis A1. When being located at the home position, the first movable nozzle 15 does not face the upper surface of the substrate W, but is located outside the processing cup 8 in a plan view. The first movable nozzle 15 is capable of moving in the vertical direction to thereby come closer to the upper surface of the substrate W or retract upwardly away from the upper surface of the substrate W.

For example, the first nozzle moving unit 31 includes a rotating shaft oriented along the vertical direction, an arm coupled to the rotating shaft and extending horizontally, and a rotating shaft drive unit which raises and lowers or rotates the rotating shaft. The rotating shaft drive unit swings the arm by rotating the rotating shaft around the vertical rotation axis. Furthermore, the rotating shaft drive unit moves the arm up and down by raising and lowering the rotating shaft in the vertical direction. The first movable nozzle 15 is fixed to the arm. In response to the arm being swung and raised and lowered, the first movable nozzle 15 is moved in the horizontal and vertical directions.

The fixed nozzle 17 is included in a rinse liquid supply unit which supplies (discharges) a rinse liquid to the upper surface of the substrate W. For example, the rinse liquid is DIW. Other than DIW, Carbonated water, electrolytic ion water, hydrogen water, ozone water, ammonia water, and hydrochloric acid water of a diluted concentration (e.g., about 10 ppm to 100 ppm) can be used as the rinse liquid.

In this preferred embodiment, the fixed nozzle 17 is connected to a DIW pipe 42 that guides DIW. When a DIW valve 52 disposed in the DIW pipe 42 is opened, the DIW is continuously discharged in a downward direction from the discharge port of the fixed nozzle 17.

The second movable nozzle 18 has a function as a low surface tension liquid supply unit (a processing liquid supply unit) which supplies (discharges) a low surface tension liquid (processing liquid) such as IPA to the upper surface of the substrate W, and a function as a gas supply unit which supplies (discharges) a gas such as a nitrogen gas ($N_2$ gas) to the upper surface of the substrate W.

The low surface tension liquid has a surface tension lower than that of a rinse liquid such as water. As the low surface tension liquid, it is possible to employ an organic solvent that does not chemically react (has poor reactivity) with the upper surface of the substrate W and the pattern formed on the substrate W.

More specifically, it is possible to employ, as the low surface tension liquid, a liquid that contains at least one of IPA, HFE (hydrofluoroether), methanol, ethanol, acetone, and Trans-1,2-dichloroethylene. Furthermore, the low surface tension liquid is not necessarily composed of a single component but may also be a mixture with another component. For example, a liquid mixture of an IPA liquid and pure water may be employed, or a liquid mixture of an IPA liquid and an HFE liquid may also be employed.

The gas discharged from the second movable nozzle 18 is preferably an inert gas. The inert gas is meant to be chemically inert with the upper surface of the substrate W and the pattern. For example, the inert gas includes rare gases such as argon or a nitrogen gas. The gas to be discharged from the second movable nozzle 18 may also be air.

The second movable nozzle 18 has a central discharge port 70 which discharges a second processing liquid in the vertical direction. The second movable nozzle 18 has a linear-flow discharge port 71 which discharges a gas linearly along the vertical direction. Furthermore, the second movable nozzle 18 has a horizontal-flow discharge port 72 which discharges a gas radially around the second movable nozzle 18 in the horizontal direction. Furthermore, the second movable nozzle 18 has a gradient-flow discharge port 73 which discharges a gas radially around the second movable nozzle 18 in a diagonally downward direction.

The gas discharged from the linear-flow discharge port 71 forms a linear air flow that is perpendicularly incident on the upper surface of the substrate W. The gas discharged from the horizontal-flow discharge port 72 forms a horizontal air flow that is parallel with the upper surface of the substrate W and covers the upper surface of the substrate W. The gas discharged from the gradient-flow discharge port 73 forms a gradient air flow in a conical profile that is diagonally incident on the upper surface of the substrate W.

The second movable nozzle 18 is connected to an IPA pipe 44 and a plurality of nitrogen gas pipes 45A, 45B, 45C. When an IPA valve 54 disposed in the IPA pipe 44 is opened, IPA is continuously discharged in a downward direction from a central discharge port 70 of the second movable nozzle 18.

When a first nitrogen gas valve 55A interposed in the first nitrogen gas pipe 45A is opened, a nitrogen gas is continuously discharged in a downward direction from the linear-flow discharge port 71 of the second movable nozzle 18. When a second nitrogen gas valve 55B interposed in the second nitrogen gas pipe 45B is opened, a nitrogen gas is continuously discharged in the horizontal direction from the horizontal-flow discharge port 72 of the second movable nozzle 18. When a third nitrogen gas valve 55C interposed in the third nitrogen gas pipe 45C is opened, a nitrogen gas is continuously discharged in the diagonally downward direction from the gradient-flow discharge port 73 of the second movable nozzle 18.

In the first nitrogen gas pipe 45A, a mass flow controller 56, which accurately controls the flow rate of a nitrogen gas flowing through the first nitrogen gas pipe 45A, is interposed. The mass flow controller 56 has a flow rate control valve. Furthermore, in the second nitrogen gas pipe 45B, a flow-rate variable valve 57B, which controls the flow rate of a nitrogen gas flowing through the second nitrogen gas pipe 45B, is interposed. Furthermore, in the third nitrogen gas pipe 45C, a flow-rate variable valve 57C, which controls the flow rate of a nitrogen gas flowing through the third nitrogen gas pipe 45C, is interposed. Furthermore, filters 58A, 58B, 58C, which remove foreign matter, are interposed in the nitrogen gas pipes 45A, 45B, 45C, respectively.

The second movable nozzle 18 is moved by a second nozzle moving unit 33 in the horizontal and vertical directions. The second movable nozzle 18 is capable of moving between a center position and a home position (a retracted position). When being located at the center position, the second movable nozzle 18 faces the rotational center of the upper surface of the substrate W. When being located at the home position, the second movable nozzle 18 does not face the upper surface of the substrate W but is located outside the processing cup 8 in a plan view. The second movable nozzle 18 is capable of moving in the vertical direction to thereby come closer to the upper surface of the substrate W or retract upwardly away from the upper surface of the substrate W.

The second nozzle moving unit 33 is constructed in the same manner as the first nozzle moving unit 31. That is, for example, the second nozzle moving unit 33 includes a rotating shaft extending in the vertical direction, an arm coupled to the rotating shaft and the second movable nozzle 18 and extending horizontally, and a rotating shaft drive unit which raises and lowers and rotates the rotating shaft.

The heater unit 6 has the form of a disk-shaped hot plate. The heater unit 6 has a facing surface 6a that faces the lower surface of the substrate W from below.

The heater unit 6 includes a plate main body 60, a plurality of support pins 61, and a heater 62. The plate main body 60 is slightly smaller than the substrate W in a plan view. The plurality of support pins 61 are protruded from the upper surface of the plate main body 60. The upper surface of the plate main body 60 and the surfaces of the plurality of support pins 61 constitute the facing surface 6a. The heater 62 may also be a resistor that is built in the plate main body 60. The facing surface 6a is heated by energizing the heater 62. Then, the heater 62 is supplied with power from a heater energizing unit 64 via a power supply line 63.

The heater unit 6 is disposed between the lower surface of the substrate W held by the chuck pins 20 and the upper surface of the spin base 21. The processing unit 2 includes a heater raising/lowering unit 65 which raises and lowers the heater unit 6 relative to the spin base 21. For example, the heater raising/lowering unit 65 includes a ball screw mechanism and an electric motor that provides a driving force to the ball screw mechanism.

To the lower surface of the heater unit 6 is coupled a raising/lowering shaft 30 which extends in the vertical direction along the rotational axis A1. The raising/lowering shaft 30 passes through the through hole 21a formed at the central portion of the spin base 21 and the hollow rotating shaft 22. The power supply line 63 passes through the raising/lowering shaft 30. The heater raising/lowering unit 65 is capable of locating the heater unit 6 at any midway position between a lower position and an upper position by raising and lowering the heater unit 6 via the raising/lowering shaft 30. When the heater unit 6 is located at the lower position, the distance between the facing surface 6a and the lower surface of the substrate W is, for example, 15 mm. When the heater unit 6 is located at the upper position, the facing surface 6a is in contact with the substrate W. When the heater unit 6 is located at the upper position, the substrate W may be supported on the facing surface 6a with the substrate W having been passed from the chuck pins 20 to the facing surface 6a.

The lower surface nozzle 19 is included in a heating medium supply unit which supplies a heating medium to a space 100 between the lower surface of the substrate W and the facing surface 6a of the heater unit 6. The lower surface nozzle 19 passes through the hollow raising/lowering shaft 30 and further penetrates the heater unit 6. The lower surface nozzle 19 has, on the upper end thereof, a discharge port 19a that faces the rotational center of the lower surface of the substrate W. The rotational center of the lower surface of the substrate W is defined as the intersection between the lower surface of the substrate W and the rotational axis A1.

The heating medium is a liquid to transfer heat to the substrate W. For example, hot water may be mentioned as the heating medium. The hot water to be used as the heating medium is, for example, DIW at a temperature higher than the room temperature (5° C. to 35° C.). The temperature of hot water to be used as a heating medium is, for example, 75° C. to 80° C. The lower surface nozzle 19 is connected to a hot water pipe 43. When a hot water valve 53 interposed in the hot water pipe 43 is opened, hot water is continuously discharged from the discharge port 19a of the lower surface nozzle 19 to the central region of the lower surface of the substrate W. The central region of the lower surface of the substrate W is defined to be a predetermined region that includes the rotational center of the lower surface of the substrate W.

Figure 3:
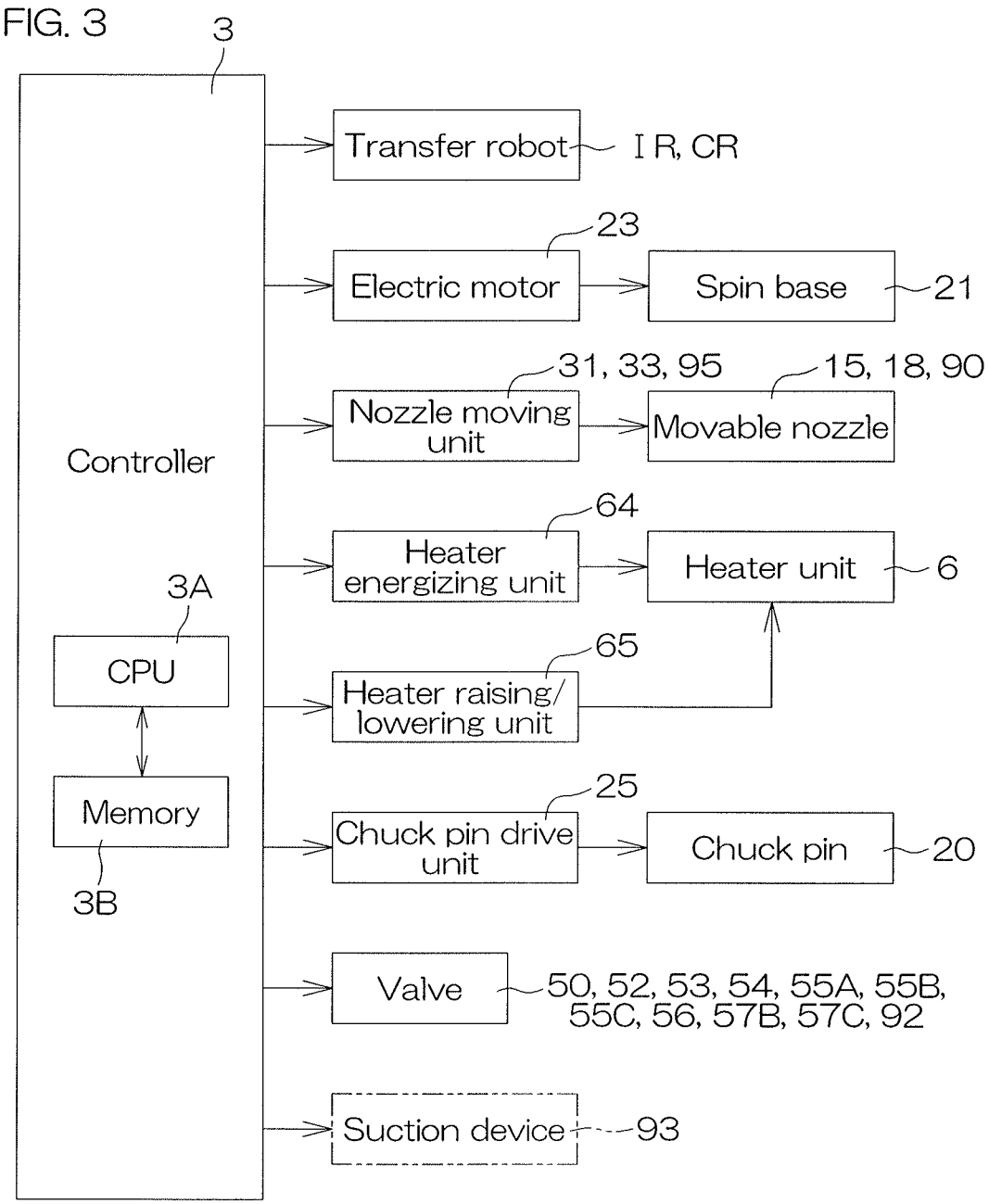
FIG. 3 is a block diagram illustrating the electrical configuration of a main portion of the substrate processing apparatus.

FIG. 3 is a block diagram illustrating an electrical arrangement of a main portion of the substrate processing apparatus 1. The controller 3 includes a microcomputer for controlling a target to be controlled provided in the substrate processing apparatus 1 on the basis of a predetermined program. More specifically, the controller 3 includes a processor (CPU) 3A and a memory 3B with programs stored therein, and is adapted for the processor 3A to execute the programs to thereby provide control in a variety of ways to substrate processing.

In particular, the controller 3 controls the operations of the transfer robots IR, CR, the electric motor 23, the nozzle moving units 31, 33, the heater energizing unit 64, the heater raising/lowering unit 65, the chuck pin drive unit 25, and the valves 50, 52, 53, 54, 55A, 55B, 55C, 56, 57B, 57C. Controlling the valves 50, 52, 53, 54, 55A, 55B, 55C, 56, 57B, 57C provides control of the discharge of the processing fluid from the corresponding nozzles.

Figure 4:
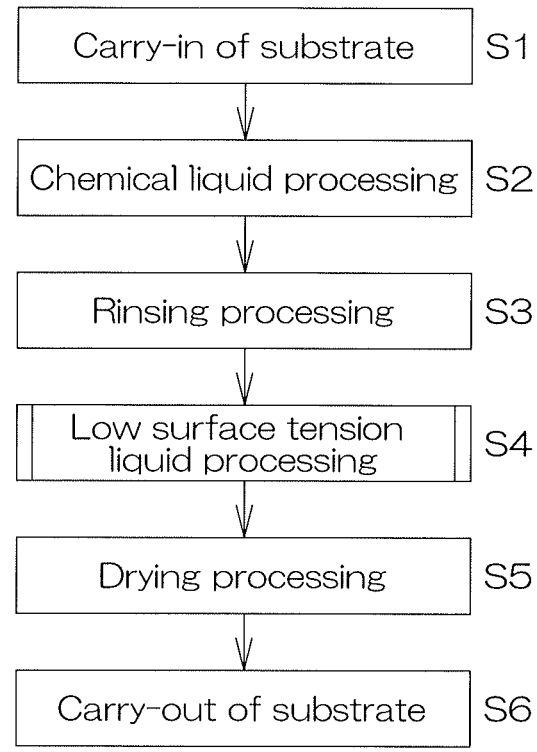
FIG. 4 is a flowchart showing an example of substrate processing by the substrate processing apparatus.

FIG. 4 is a flowchart showing an example of substrate processing by the substrate processing apparatus 1 and mainly illustrates the processing that is achieved by the controller 3 executing programs.

For example, as illustrated in FIG. 4, in the substrate processing by the substrate processing apparatus 1, carry-in of a substrate (S1), chemical liquid processing (S2), rinsing processing (S3), low surface tension liquid processing (S4), drying processing (S5), and carry-out of the substrate (S6) are executed in this order.

In the substrate processing, first, carry-in of the substrate is executed (S1). During carry-in of the substrate (S1), the heater unit 6 is located at the lower position, and each of the nozzles 15,18 is located at the retracted position. A substrate W to be processed is located by the transfer robot IR, CR from the carrier C into the processing unit 2, and then handed over to the chuck pins 20 (S1). After that, the substrate W is held horizontally with the chuck pins 20 of the spin chuck 5 (the substrate holding step) until the substrate W is carried out by the transfer robot CR.

Next, after the transfer robot CR retracts out of the processing unit 2, the chemical liquid processing (S2) is started. The electric motor 23 rotates the spin base 21. This causes the substrate W retained horizontally to be rotated (the substrate rotational step). Meanwhile, the first nozzle moving unit 31 disposes the first movable nozzle 15 at a chemical liquid processing position above the substrate W. The chemical liquid processing position may also be a position that allows the chemical liquid discharged from the first movable nozzle 15 to reach the rotational center of the upper surface of the substrate W. Then, the chemical liquid valve 50 is opened. This causes the chemical liquid to be supplied from the first movable nozzle 15 to the upper surface of the substrate W being rotated (the chemical liquid supply step). The supplied chemical liquid is spread over the entire upper surface of the substrate W by a centrifugal force.

Next, after a certain period of time of the chemical liquid processing (S2), the rinsing processing (S3) is executed to replace the chemical liquid with DIW (the rinse liquid) on the substrate W and thereby remove the chemical liquid on the substrate W.

More specifically, the chemical liquid valve 50 is closed, and the DIW valve 52 is opened. This causes DIW to be supplied from the fixed nozzle 17 to the upper surface of the substrate W being rotated (the rinse liquid supply step). The supplied DIW is spread over the entire upper surface of the substrate W by a centrifugal force. The DIW washes away the chemical liquid on the substrate W. Meanwhile, the first nozzle moving unit 31 retracts the first movable nozzle 15 from above the substrate W to the retracted position.

Figure 5:
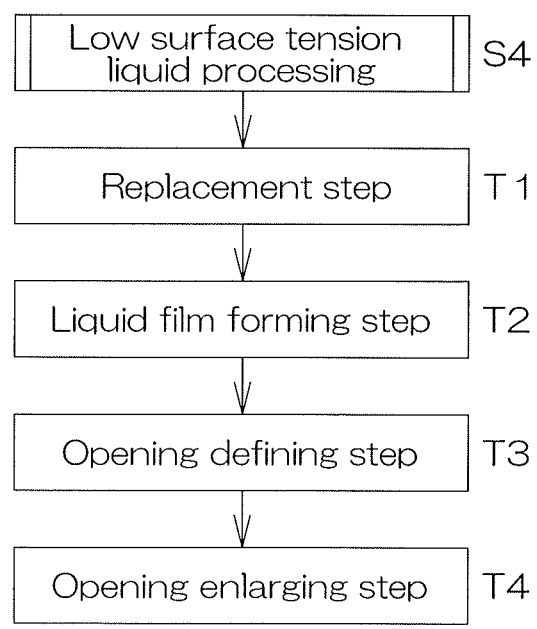
FIG. 5 is a flowchart showing an example of low surface tension liquid processing of the substrate processing (S4 of FIG. 4).

Next, as will be discussed later in more detail, after a certain period of time of the rinsing processing (S3), the low surface tension liquid processing (S4) is executed. In the low surface tension liquid processing (S4), the DIW (the rinse liquid) on the substrate W is replaced with IPA (the low surface tension liquid), and after that, the low surface tension liquid on the substrate W is removed. FIG. 5 is a flowchart showing the low surface tension liquid processing (S4).

In the low surface tension liquid processing (S4), IPA is first supplied from the second movable nozzle 18 to the upper surface of the substrate W, thereby replacing the DIW on the substrate W with the IPA (the replacement step T1). Then, continuing to supply IPA from the second movable nozzle 18 causes the liquid film of IPA to be formed on the substrate W (the liquid film forming step T2). Then, a blowing of nitrogen gas from the second movable nozzle 18 defines an opening in the central region of the liquid film of IPA (the opening defining step T3). Subsequently, since a centrifugal force caused by the rotation of the substrate W acts, the opening is enlarged (the opening enlarging step T4). In the opening enlarging step T4, the IPA on the substrate W is finally removed out of the substrate W.

After that, the drying processing (S5) is executed to dry the upper and lower surfaces of the substrate W. More specifically, the electric motor 23 rotates the spin base 21 at a high speed (e.g., 800 rpm). As a result, a high centrifugal force acts upon the IPA on the substrate W, and the IPA on the substrate W is shaken off around the substrate W.

After that, the transfer robot CR having entered the processing unit 2 scoops up a processed substrate W from the chuck pins 20 of the spin chuck 5 and then carries out the substrate W out of the processing unit 2 (S6). The substrate W is handed over from the transfer robot CR to the transfer robot IR, and then stored by the transfer robot IR in the carrier C.

Next, referring to FIG. 6A to FIG. 6G, the low surface tension liquid processing (S4) will be described in more detail. FIG. 6A to FIG. 6G are diagrammatic cross-sectional views illustrating the low surface tension liquid processing (S4).

Figure 6A:
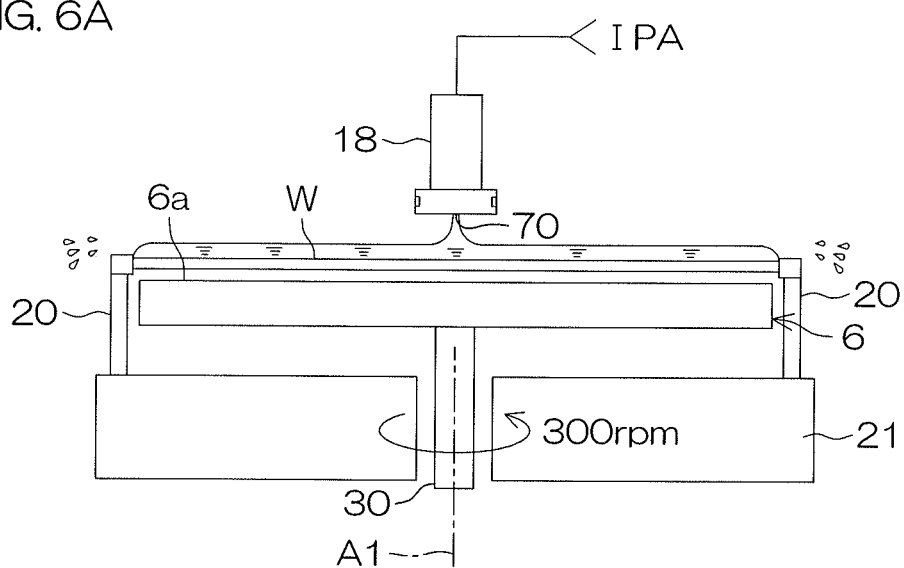

First, referring to FIG. 6A, the replacement step T1 is executed. The second nozzle moving unit 33 disposes the second movable nozzle 18 at the IPA supply position. When the second movable nozzle 18 is located at the IPA supply position, the central discharge port 70 of the second movable nozzle 18 faces the rotational center of the upper surface of the substrate W. Then, the DIW valve 52 is closed to stop the supply of DIW to the upper surface of the substrate W. Subsequently, with the second movable nozzle 18 having reached the IPA supply position, the IPA valve 54 is opened. Thereby, IPA is supplied from the second movable nozzle 18 to the upper surface of the substrate W being rotated. The supplied IPA is spread over the entire upper surface of the substrate W by a centrifugal force. The DIW on the substrate W is replaced with IPA.

In the replacement step T1, the electric motor 23 changes the rotational speed of the spin base 21 to a predetermined replacement speed. The replacement speed is, for example, 300 rpm. In the replacement step T1, the heater raising/lowering unit 65 disposes the heater unit 6 at a first position that is located in close proximity to the substrate W but without contacting the substrate W. When the heater unit 6 is located at the first position, the facing surface 6a of the heater unit 6 is spaced apart from the lower surface of the substrate W in the downward direction, for example, by 2 mm. During execution of the substrate processing, the heater energizing unit 64 supplies power to the heater unit 6 such that the heater unit 6 is held at a certain temperature (e.g., 180° C. to 220° C.)

Figure 6B:
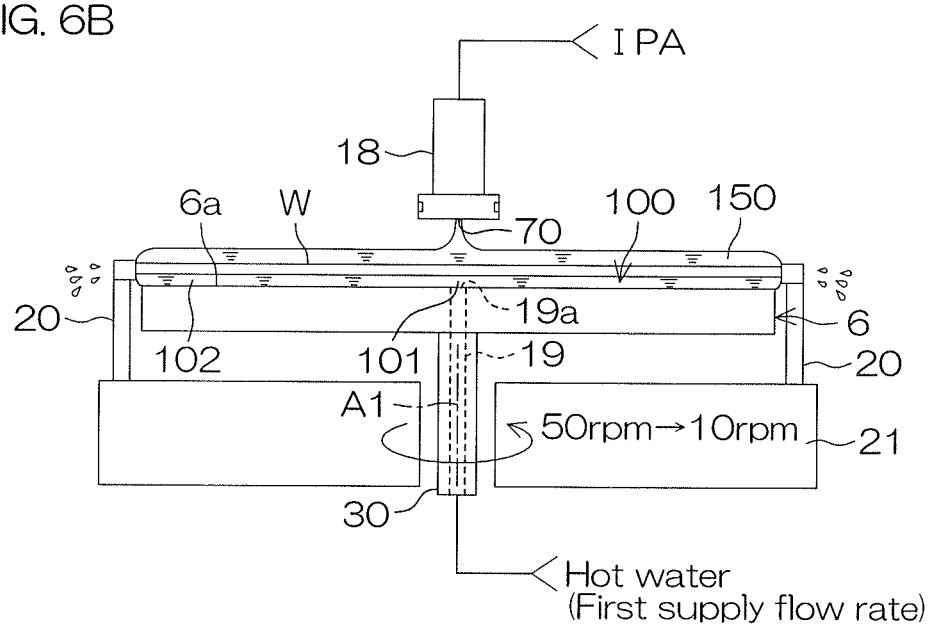
Figure 6C:
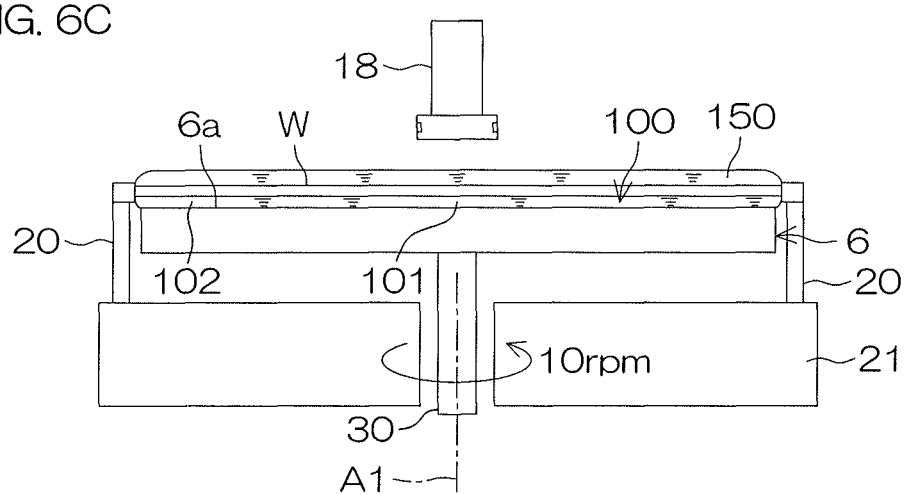

Next, referring to FIG. 6B and FIG. 6C, the liquid film forming step T2 is executed.

As illustrated in FIG. 6B, in the liquid film forming step T2, the liquid film 150 of IPA is formed on the substrate W by continuing to supply IPA onto the substrate W from the second movable nozzle 18 even after the DIW on the substrate W is substituted by IPA.

In the liquid film forming step T2, the heater raising/lowering unit 65 maintains the heater unit 6 at the first position. In the liquid film forming step T2, the hot water valve 53 is opened. This starts to discharge (supply) hot water as a heating medium to the space 100 from the discharge port 19a of the lower surface nozzle 19 (the heating medium supply start step). Since the hot water is supplied to a position between the central region of the lower surface of the substrate W and the facing surface 6a of the heater unit 6 in the space 100, the hot water discharged from the discharge port 19a of the lower surface nozzle 19 is gradually spread radially in the outward direction from a portion (a central portion 101 of the space 100) between the central region of the lower surface of the substrate W and the heater unit 6 in the space 100. The supply of the hot water is continued, thereby finally filling the space 100 with hot water (the liquid filling step).

In the liquid film forming step T2, the electric motor 23 decelerates the rotation of the spin base 21 to change the rotational speed to a predetermined liquid film sustaining speed. The liquid film sustaining speed is, for example, 10 to 50 rpm. In the liquid film forming step T2, the rotation of the spin base 21 may be decelerated in a stepwise manner. More specifically, the rotation of the spin base 21 is decelerated to 50 rpm and then maintained for a predetermined period of time in that state, and is subsequently decelerated to 10 rpm. Hot water is supplied to the space 100 while the substrate W is being rotated (the rotational supply step).

During the time from the start of supplying hot water until the space 100 is filled with the hot water, the lower surface nozzle 19 supplies the hot water to the space 100 at a first supply flow rate. For example, the first supply flow rate is 500 cc/min. The hot water supplied to the space 100 (the hot water filled in the space 100) is heated by the heater unit 6 (the liquid filling heating step). The liquid filling heating step is continued at least to some midpoint of the opening enlarging step T4.

Referring to FIG. 6C, in the liquid film forming step T2, after the space 100 is filled with hot water, the hot water valve 53 is closed. Thereby, the supply of hot water to the space 100 is stopped after the space 100 is filled with the hot water and before the opening defining step T3 is started (the heating medium supply stopping step). Since the supply of the heating medium is stopped, the hot water located at the space 100 is no longer replaced (exchanged). Thus, stopping the supply of the hot water to the space 100 will cause an increase in the temperature of the hot water filled in the space 100 due to heat transferred from the heater unit 6.

Then, the IPA valve 54 is closed. This causes the supply of IPA from the second movable nozzle 18 to the upper surface of the substrate W to be stopped. This leads to a puddle state with the liquid film 150 of IPA supported on the substrate W.

The substrate W is heated to the boiling point of IPA (82.4° C.) or higher by receiving heat from the heater unit 6 via the hot water filled in the space 100. The liquid film 150 on the substrate W is heated by the substrate W. In the liquid film 150, the IPA is thereby vaporized on the interface with the upper surface of the substrate W. A vapor-phase layer of an IPA gas is thereby produced between the upper surface of the substrate W and the liquid film 150. Thus, in the entire region of the upper surface of the substrate W, the liquid film 150 is supported on top of the vapor-phase layer.

Next, the opening defining step T3 and the opening enlarging step T4 are executed.

Figure 6D:
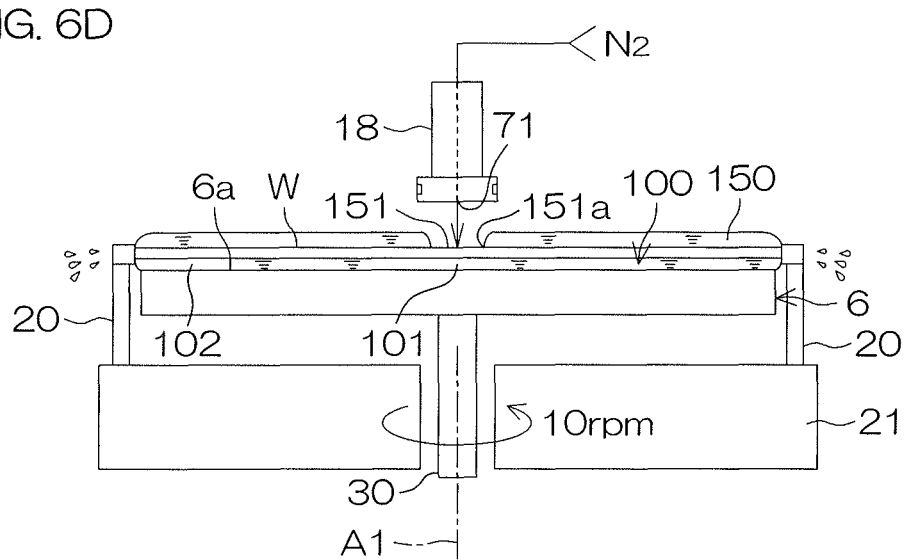

Referring to FIG. 6D, while the substrate W is heated in the liquid filling heating step such that the temperature of the substrate W is at the boiling point of IPA or higher, the opening defining step T3 is executed. More specifically, the second nozzle moving unit 33 disposes the second movable nozzle 18 at the gas supply position. When the second movable nozzle 18 is located at the gas supply position, the linear-flow discharge port 71 of the second movable nozzle 18 faces the rotational center of the upper surface of the substrate W. With the second movable nozzle 18 having reached the gas supply position, the first nitrogen gas valve 55A is opened. This allows the gas to be discharged (supplied) from the linear-flow discharge port 71 of the second movable nozzle 18.

The linear air flow formed by the gas discharged from the linear-flow discharge port 71 pushes the IPA in the central region of the liquid film 150 radially in the outward direction. An opening 151 of the liquid film 150 is thereby quickly defined. As described above, the second movable nozzle 18 functions as an opening defining unit which defines the opening 151 in the central region of the liquid film 150. In the opening defining step T3, the heater raising/lowering unit 65 maintains the heater unit 6 at the first position.

Figure 6E:
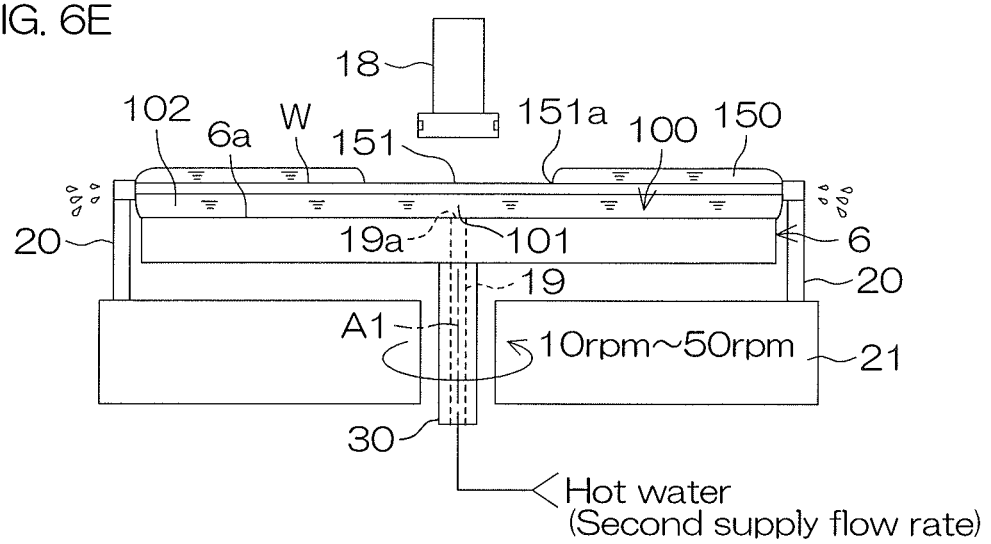
Figure 6F:
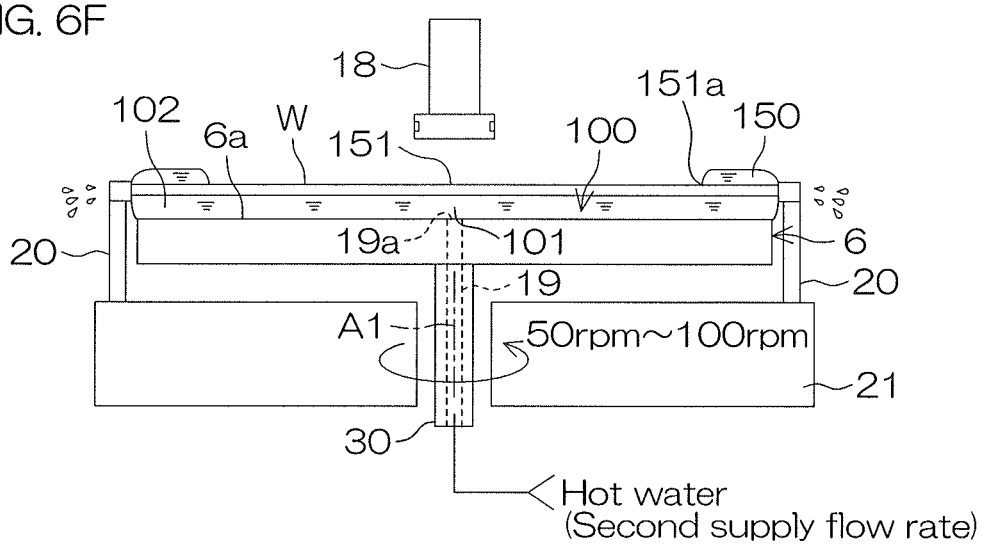

Referring to FIG. 6E and FIG. 6F, the opening 151 is enlarged toward the outer circumference of the substrate W so as to move the liquid film 150 on the vapor-phase layer, thereby executing the opening enlarging step T4.

As illustrated in FIG. 6E, in the opening enlarging step T4, the electric motor 23 decelerates the rotation of the spin base 21 and changes the rotational speed to a predetermined first enlargement speed. The first enlargement speed is, for example, 10 to 50 rpm. Due to the action of a centrifugal force caused by the rotation of the substrate W, the IPA on the substrate W is removed out of the substrate W such that the opening is enlarged.

In the opening enlarging step T4, the heater raising/lowering unit 65 lowers the heater unit 6 from the first position to a second position. The second position is spaced further away from the substrate W relative to the first position. When the heater unit 6 is located at the second position, the facing surface 6a of the heater unit 6 is spaced apart from the lower surface of the substrate W, for example, by 4 mm.

Then, the hot water valve 53 is opened. The hot water as a heating medium is thereby supplied to the space 100 between the lower surface of the substrate W and the facing surface 6a of the heater unit 6. It is restarted to discharge (supply) hot water from the discharge port 19a of the lower surface nozzle 19 to a portion (the central portion 101) between the central region of the lower surface of the substrate W and the facing surface 6a of the heater unit 6 in the space 100. Newly supplying hot water to the central portion 101 causes the hot water located in a portion (a circumferential edge portion 102) between the circumferential edge region of the lower surface of the substrate W and the facing surface 6a of the heater unit 6 in the space 100 to be pushed out of the space 100. As described above, hot water is newly continually supplied to the central portion 101, thereby replacing the hot water located in the space 100 with new hot water (the heating medium replacing step). The circumferential edge region of the lower surface of the substrate W is defined as a region that includes the circumferential edge portion of the substrate W on the lower surface of the substrate W. While the heating medium replacing step is being performed, the heater unit 6 is located at the second position.

In the heating medium replacing step, the lower surface nozzle 19 supplies hot water to the space 100 at a second supply flow rate that is less than the first supply flow rate. For example, the second supply flow rate is 100 cc/min. Thus, the supply flow rate of hot water in the heating medium replacing step is less than the supply flow rate of hot water before the heating medium supply stopping step. The hot water is supplied to the space 100 while the substrate W is being rotated.

In the substrate processing in which the liquid film 150 is forced out of the substrate W by a centrifugal force, as a circumferential edge 151a of the opening 151 approaches the circumferential edge region of the upper surface of the substrate W, a force, by which the IPA located radially in the inward direction with respect to the circumferential edge region of the upper surface of the substrate W pushes outward the IPA located in the circumferential edge region of the upper surface of the substrate W, decreases. It is thereby difficult for the IPA on the circumferential edge region of the upper surface of the substrate W to be pushed out of the substrate W. The circumferential edge region of the upper surface of the substrate W refers to a region in the vicinity of the circumferential edge portion of the substrate W on the upper surface of the substrate W.

Therefore, as illustrated in FIG. 6F, when the opening 151 is enlarged and thereby the circumferential edge 151a of the opening 151 reaches the circumferential edge region of the upper surface of the substrate W, the electric motor 23 accelerates the rotation of the spin base 21 and changes the rotational speed to a predetermined second enlargement speed. For example, the second enlargement speed is 50 to 100 rpm. Thereby, the IPA on the substrate W can be removed.

As illustrated in FIG. 6G, after the liquid film 150 is removed from the substrate W, the hot water valve 53 is closed. Then, the heater raising/lowering unit 65 lowers the heater unit 6 from the second position to the lower position. The liquid filled state of the space 100 is thereby cancelled. In other words, in the substrate processing, the liquid filling heating step is continued from some midpoint in the liquid film forming step T2 until the opening enlarging step T4 is ended. Since the substrate W continues to be rotated even after the heater unit 6 reaches the lower position, the hot water adhered to the lower surface of the substrate W is removed by a centrifugal force.

At this time, the first nitrogen gas valve 55A and the third nitrogen gas valve 55C may be opened to discharge a nitrogen gas from the second movable nozzle 18. More specifically, the nitrogen gas discharged from the linear-flow discharge port 71 of the second movable nozzle 18 forms a linear air flow, while the nitrogen gas discharged from the gradient-flow discharge port 73 of the second movable nozzle 18 forms a gradient air flow. The linear air flow and the gradient air flow are blown to the upper surface of the substrate W and thereby vaporize the liquid component slightly remaining on the substrate W.

Next, as described above, the drying processing (S5) is performed, and after that, the substrate W is carried out from the processing unit 2. In this manner, the substrate processing by the substrate processing apparatus 1 is ended.

FIG. 7A and FIG. 7B are diagrammatic cross-sectional views illustrating the formation of the vapor-phase layer 152 on the front surface of the substrate W. A fine pattern 161 is formed on the front surface of the substrate W. The pattern 161 includes a fine protrusion structure 162 that is formed on the front surface of the substrate W. The structure 162 may include an insulator film or a conductor film. Furthermore, the structure 162 may also be a stacked layer which has a plurality of films stacked in layers. When linear structures 162 are adjacent to each other, a groove is formed between the structures. In this case, the structure 162 may be approximately 10 nm to 45 nm in width W1, and the separation W2 between each of the structures 162 may be approximately 10 nm to a few μm. For example, the height T of the structure 162 may be approximately 50 nm to 5 μm. When the structure 162 is cylindrical, a hole is to be formed inside the structure 162.

In the liquid film forming step T2, as illustrated in FIG. 7A, the liquid film 150 formed on the front surface of the substrate W fills the inside of the pattern 161 (the space between each of adjacent structures 162 or the inner space of the tubular structures 162).

When the temperature of the hot water is at the boiling point of IPA or higher in the liquid filling heating step, the IPA in contact with the front surface of the substrate W is vaporized to produce a gas of IPA, thus forming the vapor-phase layer 152 as illustrated in FIG. 7B. The vapor-phase layer 152 fills the inside of the pattern 161 and is further extended to outside the pattern 161, thus forming an interface 155 with the liquid film 150 above the upper surface 162A of the structure 162. The liquid film 150 is supported on the interface 155. In this state, since the liquid surface of the IPA is not in contact with the pattern 161, any pattern collapse caused by the surface tension of the liquid film 150 will not occur.

When the substrate W is heated and the IPA is thereby vaporized, the liquid-phase IPA is instantaneously discharged from inside the pattern 161. Then, the liquid-phase IPA is supported on the formed vapor-phase layer 152 and is spaced apart from the pattern 161. In this manner, the vapor-phase layer 152 of IPA is interposed between the upper surface of the pattern 161 (the upper surface 162A of the structure 162) and the liquid film 150 to support the liquid film 150.

As illustrated in FIG. 7C, a crack 153 occurring in the liquid film 150 floating from the upper surface of the substrate W would cause a defect such as a watermark after having been dried. Therefore, in this preferred embodiment, the supply of IPA is stopped after the rotation of the substrate W is decelerated, and then a thick liquid film 150 is formed on the substrate W so as to avoid the occurrence of the crack 153.

In a state where the liquid film 150 is supported on the vapor-phase layer 152, the frictional resistance acting upon the liquid film 150 is small enough to be regarded as zero. Thus, when a force parallel with the upper surface of the substrate W is applied to the liquid film 150, the liquid film 150 is easily moved. In this preferred embodiment, the opening 151 may be defined at the center of the liquid film 150 to thereby produce an IPA flow by a difference in temperature in a circumferential edge 101a of the opening 151 and move the liquid film 150 supported on the vapor-phase layer 152, thus helping the enlargement of the opening 151.

In the first preferred embodiment, hot water (a heating medium) is supplied to the space 100 between the heater unit 6 and the substrate W to thereby fill the space 100 with hot water, and the heater unit 6 heats the hot water (the liquid filling heating step). Then, in the state in which the substrate W is heated such that the temperature of the substrate W is at the boiling point of IPA (a processing liquid, a low surface tension liquid) or higher in the liquid filling heating step, the opening 151 is defined in the central region of the liquid film 150 of IPA on the substrate W (the opening defining step). Subsequently, while the substrate W is being rotated, the opening 151 is enlarged (the opening enlarging step). Then, the liquid filling heating step is executed in parallel with the opening enlarging step.

According to this preferred embodiment, in the liquid filling heating step, the hot water filled in the space 100 between the heater unit 6 and the substrate W is heated by the heater unit 6, so that the hot water filled in the space 100 heats the substrate W. Thus, while the substrate W is being held by the plurality of chuck pins 20 provided on the spin base 21, the heater unit 6 is capable of heating the substrate W via the hot water. Thus, in a state where the spin base 21 is being rotated to rotate the substrate W, the substrate W can be sufficiently heated.

Since the substrate W is heated to the boiling point of IPA or higher when the opening 151 is defined on the liquid film 150, the portion of the liquid film 150 in the vicinity of the upper surface of the substrate W is heated to the boiling point of IPA. The vapor-phase layer 152 is thus produced between the liquid film 150 and the upper surface of the substrate W. Then, when the opening 151 is enlarged, the liquid filling heating step is executed. Thus, it is possible to enlarge the opening 151 while preventing the temperature of the substrate W from being lowered. Therefore, while maintaining a state where the vapor-phase layer 152 is formed, the opening 151 can be enlarged.

In the first preferred embodiment, in the liquid filling heating step, hot water is supplied to the space 100 while the substrate W is being rotated (the rotational supply step). Thus, a centrifugal force acts on the hot water supplied to the space 100. This enables the hot water to be spread over the entire space 100.

In the first preferred embodiment, the liquid filling heating step is continued until the opening enlarging step T4 is ended. Thus, in the opening enlarging step T4, it is ensured that the vapor-phase layer 152 can be maintained with greater ease.

In the first preferred embodiment, the supply of hot water is stopped after the space 100 is filled with hot water and before the opening defining step is started (the heating medium supply stopping step). Thus, after the space 100 between the heater unit 6 and the substrate W is filled with hot water and before the opening defining step is started, the heating medium located in the space 100 is not replaced. Thus, until the opening defining step is started after the supply of hot water to the space 100 is stopped, the temperature of the heating medium located in the space 100 is sufficiently increased by the heat transferred from the heater unit 6. Thus, in the opening defining step, the vapor-phase layer 152 tends to be maintained with greater ease.

The hot water located between the circumferential edge of the substrate W and the heater unit 6 tends to be lowered in temperature by being affected from outside the space 100. In the first preferred embodiment, during execution of the opening enlarging step T4, hot water is supplied to a position between the central region of the lower surface of the substrate W and the heater unit 6 (the central portion 101 of the space 100), thereby replacing the hot water located in the space 100 (the heating medium replacing step).

Thus, if hot water is supplied to a position between the central region of the lower surface of the substrate W and heater unit during execution of the opening enlarging step T4, the hot water located in the circumferential edge portion 102 of the space 100 can be pushed out of the space 100 by the hot water located inwardly with respect to the circumferential edge portion 102 in the space 100. Thus, the heating medium located in the circumferential edge portion 102 of the space 100 is replaced with the hot water which is hardly affected by outside the space 100 and which is located inwardly with respect to the circumferential edge portion 102 in the space 100. Thus, until the opening enlarging step T4 is ended, the temperature in the vicinity of the circumferential edge portion of the substrate W can be maintained at the boiling point of the processing liquid or higher with greater ease.

Furthermore, the flow rate of the heating medium is relatively high before the heating medium supply stopping step. It is thus possible to shorten the time required to raise the temperature of the substrate W to the boiling point of IPA or higher in the liquid filling heating step.

On the other hand, the flow rate of hot water is relatively low when the hot water located between the substrate W and the heater unit 6 is replaced. It is thus possible to lengthen the time required for the hot water supplied to the central portion 101 of the space 100 to move to the circumferential edge portion 102 of the space 100. Thus, the hot water supplied to the central portion 101 of the space 100 is more sufficiently heated by the heater unit 6 until the hot water is moved to the circumferential edge portion 102 of the space 100.

In the first preferred embodiment, in the opening defining step, the heater unit 6 is disposed at the first position that is located in close proximity to the substrate W. Then, in the heating medium replacing step, the heater unit is disposed at the second position that is further spaced apart from the substrate W than the first position.

According to this method, in the opening defining step T3, the heater unit 6 is disposed at the first position. Thus, the space 100 is relatively narrow. Thus, the time required to turn the space 100 into the liquid filled state can be shortened. On the other hand, in the heating medium replacing step, the heater unit 6 is disposed at the second position that is further spaced apart from the substrate W than the first position. Thus, the space 100 is relatively wide, so that the amount of hot water that is replaced in a unit time by supplying hot water can be made relatively small. Therefore, supplying hot water can prevent the temperature of the hot water located in the space 100 from being drastically lowered.

In the first preferred embodiment, the rinse liquid supply step and the replacement step are executed, and in the liquid film forming step, the liquid film 150 of IPA as the low surface tension liquid is formed. The liquid film 150 of IPA (the low surface tension liquid) having a lower surface tension than DIW (a rinse liquid) is removed from the substrate W, thereby enabling the upper surface of the substrate W to be dried. It is thus possible to further reduce the surface tension that acts upon the upper surface of the substrate W when the liquid film 150 is removed from the substrate W.

Second Preferred Embodiment

Figure 8:
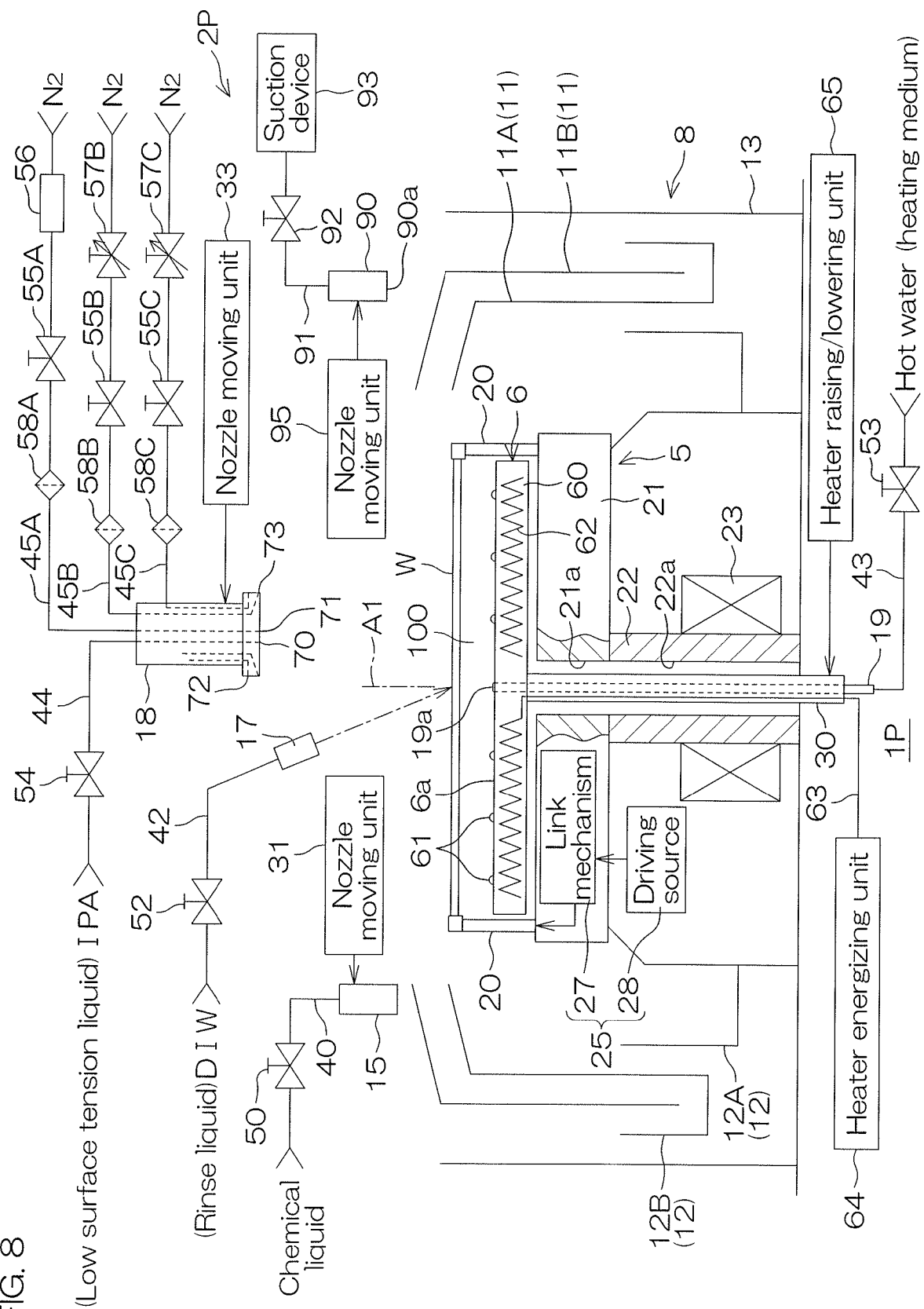
FIG. 8 is a schematic view illustrating a processing unit provided in a substrate processing apparatus according to a second preferred embodiment.
Figure 9:
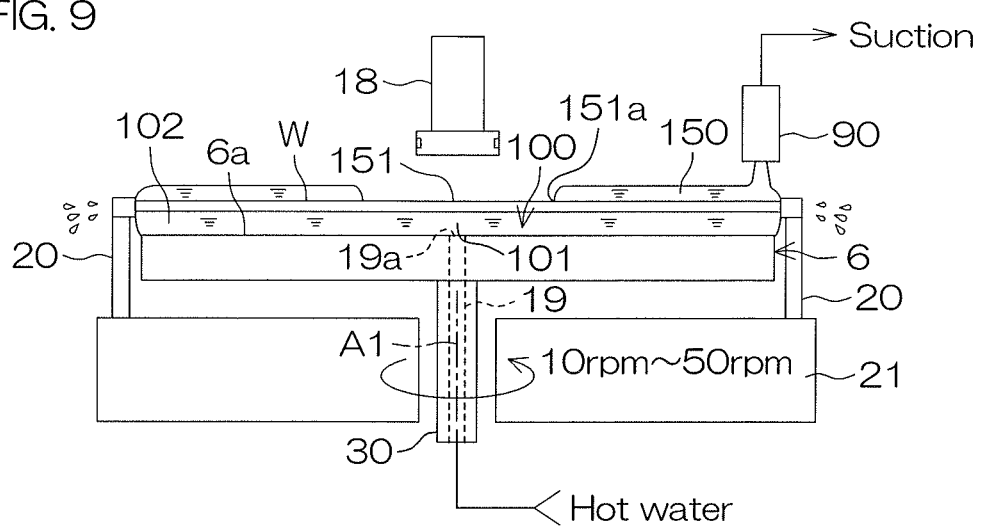
FIG. 9 is a diagrammatic cross-sectional view illustrating the low surface tension liquid processing (S4 of FIG. 4) in substrate processing by the substrate processing apparatus according to the second preferred embodiment.
Figure 10:
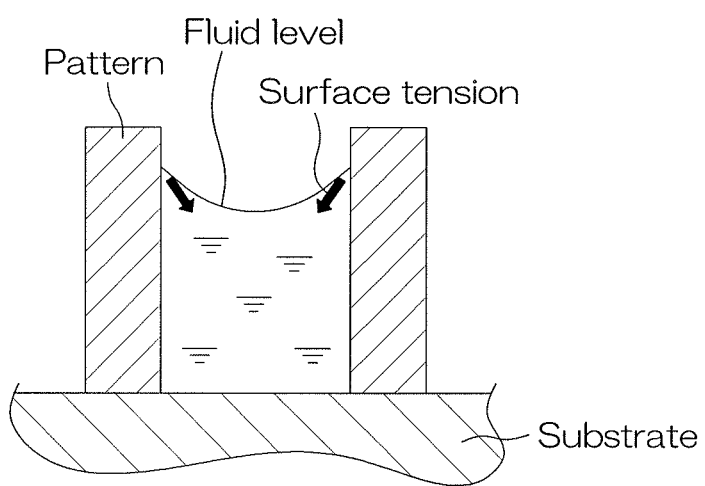
FIG. 10 is a diagrammatic cross-sectional view illustrating the principle of pattern collapse due to surface tension.

FIG. 8 is a schematic view illustrating a processing unit 2P provided in a substrate processing apparatus 1P according to a second preferred embodiment. FIG. 9 is a diagrammatic cross-sectional view illustrating the low surface tension liquid processing (S4) in the substrate processing by the substrate processing apparatus 1P. In FIG. 8 and FIG. 9, the same members as those described in the above are given the same reference symbols and description thereof will be omitted.

The processing unit 2P according to the second preferred embodiment is different from the processing unit 2 according to the first preferred embodiment in that there is provided a suction nozzle 90.

The suction nozzle 90 is included in a suction unit that sucks the IPA (a processing liquid) on the substrate W. The suction nozzle 90 is connected to an end of a suction pipe 91 that guides IPA. The suction pipe 91 has a suction valve 92 interposed therein to open or close the flow path. The other end of the suction pipe 91 is connected to a suction device 93 such as a vacuum pump. The suction valve 92 is opened while a suction port 90*a* provided on the lower end of the suction nozzle 90 is in contact with the IPA on the substrate W, thereby starting the suction of the IPA by the suction device 93.

The suction nozzle 90 is moved by a suction nozzle moving unit 95 in the horizontal and vertical directions. The suction nozzle 90 is capable of moving between a center position and a home position (a retracted position). When being located at the center position, the suction nozzle 90 faces the rotational center of the upper surface of the substrate W. When being located at the home position, the suction nozzle 90 does not face the upper surface of the substrate W but is located outside the processing cup 8 in a plan view. More specifically, the suction nozzle 90 is capable of moving in the vertical direction to thereby come closer to the upper surface of the substrate W or retract upwardly away from the upper surface of the substrate W.

The suction nozzle moving unit 95 is constructed in the same manner as the first nozzle moving unit 31. That is, for example, the suction nozzle moving unit 95 includes a rotating shaft extending in the vertical direction, an arm coupled to the rotating shaft and the suction nozzle 90 and extending in the horizontal direction, and a rotating shaft drive unit which raises and lowers and rotates the rotating shaft.

The suction valve 92, the suction device 93, and the suction nozzle moving unit 95 are controlled by the controller 3 (see FIG. 3).

The substrate processing apparatus 1P can be used to execute the same substrate processing as that executed by the substrate processing apparatus 1.

In the substrate processing by the substrate processing apparatus 1P, before the opening enlarging step T4 is started, the suction nozzle moving unit 95 disposes the suction nozzle 90 at a position that faces the circumferential edge of the substrate W. Then, in the opening enlarging step T4, as illustrated in FIG. 9, the suction valve 92 is opened, and the suction device 93 starts suction. Then, the suction nozzle 90 starts suction of the IPA that constitutes the liquid film 150 on the substrate W. This helps the enlargement of the opening 151 on the substrate W (the removal of the liquid film 150). It is thus possible to shorten the time required to execute the opening enlarging step T4. In turn, the time required for the substrate processing can be shortened.

In the second preferred embodiment, in a state where the suction nozzle 90 is disposed at a position facing the circumferential edge of the substrate W, the opening enlarging step T4 is started. However, in the opening enlarging step T4, as the opening 151 is enlarged, the suction nozzle 90 may also be moved to outside the substrate W. At this time, the suction nozzle 90 is moved while being maintained at the position between the circumferential edge 151*a* of the opening 151 and the circumferential edge of the substrate W.

The present invention is not limited to the preferred embodiments described above, but may also be embodied in still other modes.

In the aforementioned preferred embodiments, during execution of the opening enlarging step T4, hot water is supplied to the space 100. However, unlike the aforementioned preferred embodiments, the supply of hot water to the space 100 may be stopped during execution of the opening enlarging step T4.

In the aforementioned preferred embodiments, in the opening enlarging step T4, the liquid film 150 is removed from the substrate W. However, at the end of the opening enlarging step T4, the liquid film 150 will not necessarily have to be completely removed. That is, after the circumferential edge 151*a* of the opening 151 has reached the outer circumferential region of the upper surface of the substrate W by enlarging the opening 151 while the substrate W is being rotated, the liquid film 150 may also be removed from the upper surface of the substrate W by following a method other than the enlargement of the opening 151. For example, methods other than the enlargement of the opening 151 may include blowing of a gas from the second movable nozzle 18 (a circumferential edge liquid film removal step). In this case, the liquid film heating step is executed in the circumferential edge liquid film removal step as well. That is, even after the opening enlarging step T4 is ended, the liquid filling heating step is executed.

In the aforementioned preferred embodiments, the liquid filling heating step is continued at least until the opening enlarging step T4 is ended. However, if the vapor-phase layer 152 can be maintained until the liquid film 150 is removed from the substrate W after the opening 151 is formed on the liquid film 150, the liquid filling heating step may be ended at some midpoint in the opening enlarging step T4, as required. That is, the liquid filling heating step may only have to be executed in parallel with the opening enlarging step T4 at least during part of the duration of the opening enlarging step T4.

The liquid filling heating step is preferably continued at least until the circumferential edge 151a of the opening 151 reaches the outer circumferential region of the upper surface of the substrate W. The outer circumferential region of the upper surface of the substrate W is located between the central region of the upper surface of the substrate W and the circumferential edge region. By cancelling the liquid filled state of the space 100 when the circumferential edge 151a of the opening 151 reaches the outer circumferential region of the upper surface of the substrate W, the lower surface of the substrate W may be dried in parallel with the removal of the liquid film 150 (the drying of the upper surface of the substrate W). Thus, the time required for the substrate processing can be shortened.

Furthermore, in the aforementioned preferred embodiments, described is such an example of the substrate processing in which the liquid film 150 of a low surface tension liquid is formed on the substrate W, and the liquid film 150 is removed from the substrate W while the vapor-phase layer 152 is maintained between the liquid film 150 and the upper surface of the substrate W.

Unlike the aforementioned preferred embodiment, the invention can also be applied to such substrate processing in which a liquid film of a processing liquid other than a low surface tension liquid (e.g., a rinse liquid such as DIW) is formed on the substrate W, and then the liquid film of the processing liquid is removed from the substrate W while a vapor-phase layer is maintained between the liquid film and the upper surface of the substrate W. In the case where the processing liquid is DIW, the low surface tension liquid processing (S4) of FIG. 4 is omitted. Instead, the replacement step T1, the liquid film forming step T2, the opening defining step T3, and the opening enlarging step T4 in FIG. 5 are executed in the rinsing processing (S3).

Furthermore, in the aforementioned preferred embodiments, the lower surface nozzle 19 is to have the discharge port 19a that faces the rotational center of the lower surface of the substrate W. However, unlike the aforementioned preferred embodiments, the lower surface nozzle 19 may also have a plurality of discharge ports that are disposed radially in the rotational direction.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A substrate processing method comprising:
a substrate holding step of holding a substrate by a substrate holding jig, the substrate holding jig being provided on an upper surface of a base and horizontally holding the substrate to be spaced apart upwardly from the upper surface of the base;
a liquid film forming step of supplying a processing liquid to an upper surface of the substrate to thereby form a liquid film of the processing liquid on the upper surface of the substrate;
a liquid filling heating step of supplying a heating medium to a space between a heater unit which is provided between the substrate and the base, and the substrate to thereby fill the space with the heating medium, and heating the heating medium by the heater unit;
an opening defining step of defining an opening in a central region of the liquid film on the substrate in a state where the substrate is heated in the liquid filling heating step such that a temperature of the substrate is a boiling point of the processing liquid or higher; and
an opening enlarging step of enlarging the opening while rotating the base to thereby rotate the substrate around a rotational axis along a vertical direction,
wherein the liquid filling heating step is executed in parallel with the opening enlarging step at least during part of a period of the opening enlarging step, and
the method further comprises a heating medium replacing step of replacing the heating medium located in the space by starting supply of the heating medium to a position between a central region of a lower surface of the substrate and the heater unit during execution of the opening enlarging step,
the method further comprises a heating medium supply stopping step of stopping supply of the heating medium after the space is filled with the heating medium and before the opening defining step is started,
a supply flow rate of the heating medium in the heating medium replacing step is less than a supply flow rate of the heating medium before the heating medium supply stopping step,
the opening defining step includes a step of disposing the heater unit at a first position that is located in close proximity to the substrate, and
the heating medium replacing step includes a step of disposing the heater unit at a second position that is further spaced apart from the substrate than the first position.

2. The substrate processing method according to claim 1, wherein
the liquid filling heating step includes a rotational supply step of supplying the heating medium to the space while rotating the substrate.

3. The substrate processing method according to claim 1, wherein the liquid filling heating step is continued at least until a circumferential edge of the opening reaches an outer circumferential region of the upper surface of the substrate.

4. The substrate processing method according to claim 1, wherein the opening defining step includes a step of defining the opening by supplying a gas to the central region of the liquid film.

5. The substrate processing method according to claim 1, wherein the opening enlarging step includes a processing liquid suction step of sucking the processing liquid, which constitutes the liquid film, through a suction nozzle.

6. The substrate processing method according to claim 1, further comprising:
a rinse liquid supply step of supplying a rinse liquid, which rinses the upper surface of the substrate, to the upper surface of the substrate; and
a replacement step of supplying a low surface tension liquid, which has a lower surface tension than that of the rinse liquid, to the upper surface of the substrate as the processing liquid to thereby replace the rinse liquid with the low surface tension liquid, wherein the liquid film forming step includes a step of forming, as the liquid film, a liquid film of the low surface tension liquid on the upper surface of the substrate.

\* \* \* \* \*